(12) United States Patent
Kikuchi et al.

(10) Patent No.: US 7,474,538 B2
(45) Date of Patent: Jan. 6, 2009

(54) SEMICONDUCTOR DEVICE MOUNTING BOARD, METHOD OF MANUFACTURING THE SAME, METHOD OF INSPECTING THE SAME, AND SEMICONDUCTOR PACKAGE

(75) Inventors: Katsumi Kikuchi, Tokyo (JP); Tadanori Shimoto, Tokyo (JP); Kazuhiro Baba, Tokyo (JP)

(73) Assignee: NEC Corporation, Tokyo (JP)

( * ) Notice: Subject to any disclaimer, the term of this patent is extended or adjusted under 35 U.S.C. 154(b) by 438 days.

(21) Appl. No.: 10/975,061

(22) Filed: Oct. 26, 2004

(65) Prior Publication Data

US 2005/0088833 A1    Apr. 28, 2005

Related U.S. Application Data

(63) Continuation of application No. PCT/JP03/06526, filed on May 26, 2003.

(30) Foreign Application Priority Data

May 27, 2002    (JP)    ............... 2002/151864

(51) Int. Cl.
H05K 7/02    (2006.01)
H05K 7/06    (2006.01)
H05K 7/08    (2006.01)
H05K 7/10    (2006.01)

(52) U.S. Cl. .................. 361/780; 361/782; 361/785

(58) Field of Classification Search ......... 361/782–785; 257/700–730, 774–780
See application file for complete search history.

(56) References Cited

U.S. PATENT DOCUMENTS

| | | | | |
|---|---|---|---|---|
| 5,874,770 A | * | 2/1999 | Saia et al. .................. 257/536 |
| 6,156,414 A | * | 12/2000 | Shimoto et al. ............. 428/209 |
| 6,204,565 B1 | * | 3/2001 | Shimoto et al. ............. 257/783 |
| 6,861,757 B2 | * | 3/2005 | Shimoto et al. ............. 257/773 |
| 2001/0013425 A1 | | 8/2001 | Rokugawa et al. |
| 2001/0020739 A1 | | 9/2001 | Honda |

FOREIGN PATENT DOCUMENTS

| | | |
|---|---|---|
| EP | 1 168 445 | 1/2002 |
| JP | 06-334334 | 12/1994 |
| JP | 08-306820 | 11/1996 |
| JP | 08-330474 | 12/1996 |
| JP | 09-064493 | 3/1997 |
| JP | 10-051105 | 2/1998 |
| JP | 11-017058 | 1/1999 |
| JP | 2000-003980 | 1/2000 |
| JP | 2000-058701 | 2/2000 |
| JP | 2000-261124 | 9/2000 |
| JP | 2000-323613 | 11/2000 |

(Continued)

OTHER PUBLICATIONS

International Search Report dated Aug. 20, 2003.
International Preliminary Examination Report dated Feb. 9, 2004.

*Primary Examiner*—Tuan T Dinh
(74) *Attorney, Agent, or Firm*—Katten Muchin Rosenman LLP

(57) ABSTRACT

A semiconductor device mounting board, a method of manufacturing the same, a method of inspecting the same, and a semiconductor package are provided. The semiconductor device mounting board is capable of implementing a high-density and fine structure corresponding to a narrowing pitch and has high mounting reliability. A semiconductor device mounting board includes a wiring construction film including an insulating layer and a wiring layer, and a first electrode pattern disposed on one surface of the wiring construction film in which a periphery of a side surface of the electrode pattern is in contact with the insulating layer. At least a rear surface of the first electrode pattern is not in contact with the insulating layer.

38 Claims, 24 Drawing Sheets

FOREIGN PATENT DOCUMENTS

| JP | 2001-024090 | 1/2001 |
| JP | 2001-257288 | 9/2001 |
| JP | 2002-026171 | 1/2002 |
| WO | WO 01/48821 | 7/2001 |

* cited by examiner

SEMICONDUCTOR DEVICE MOUNTING BOARD, METHOD OF MANUFACTURING THE SAME, METHOD OF INSPECTING THE SAME, AND SEMICONDUCTOR PACKAGE

CROSS-REFERENCE TO RELATED APPLICATION

The present application is a continuation of International Application No. PCT/JP03/06526 which was filed on May 26, 2003, which is herein incorporated by reference.

TECHNICAL FIELD

The present invention relates to a semiconductor device mounting board, a method of manufacturing the same, a method of inspecting the same, and a semiconductor package in which the semiconductor device mounting board is used to implement a high-density, high-speed, and high-frequency module and/or a high-frequency system by mounting various devices such as a semiconductor device at a high density.

RELATED ART

Recently, with an increasing number of terminals and a decreasing pitch due to increase in the speed and integration of semiconductor devices, a higher density and a finer pitch are desired also for a packaging wiring board to mount these semiconductor devices thereon. Mounting boards broadly used at present are, for example, a ceramic substrate, a buildup substrate, and a tape substrate.

The ceramic substrate includes, as disclosed by Japanese Patent Laid-Open Publication No. 8-330474, an insulator substrate made of alumina and the like and a wiring conductor formed on a surface thereof, the conductor being made of a refractory metal such as W or Mo.

Moreover, the buildup substrate includes, as disclosed by Japanese Patent Laid-Open No. 11-17058 and Japanese Patent No. 2679681, a printed board on which a fine circuit is formed in multilayers including copper wiring through etching and plating by use of an organic resin as an insulator material.

Additionally, the tape substrate includes copper wiring formed on a film such as a polyimide-based film described in Japanese Patent Laid-Open No. 2000-58701.

PROBLEM TO BE SOLVED BY THE INVENTION

However, the conventional techniques are attended with problems as described below.

The ceramic substrate has, since the ceramic constituting the insulator substrate has a characteristic of rigidness and fragility, a problem that damages such as chips and cracks easily take place in a manufacturing process and a transporting process and hence yield is lowered.

Furthermore, the ceramic board is manufactured in a process in which wiring is printed on a green sheet before the firing and then each sheet is laminated and fired. The manufacturing process is attended with a problem, that is, contraction occurs due to the firing at a high temperature and contour defects easily take place in the board after the firing such as a warp, deformation, and dimensional fluctuation. The contour defects lead to a problem that rigorous flatness required for the boards such as a highly integrated circuit board and a board of a flip chip cannot be sufficiently coped with. That is, there exists a problem that since such contour defects prevent increase of pins, high density, and fine structure in the circuit and leads to loss of flatness in a semiconductor device mounting section is lost; cracks, peeling, and the like easily occur in a connecting section between the semiconductor device and the board and hence reliability of the semiconductor device is reduced.

In addition, in the buildup substrate, there occurs a warp due to thermal expansion difference between a printed board used as a core material and an insulator resin film formed as a surface layer. This warp also becomes a hindrance when a semiconductor device having many pins is connected to the board and hence, as described above, prevents high density and fine structure of the circuit and lowers yield of the buildup substrate.

Furthermore, in a substrate using a polyimide(s)-based tape or the like, there exists a problem that large positioning errors occur due to expansion and contraction of the tape base-material when semiconductor device is mounted on the board and hence the board cannot fully cope with the increase in density of the circuit.

In this situation, to solve these problems, there has been proposed a packaging wiring board in which buildup structure is formed on a base plate including a metallic plate as disclosed by Japanese Patent Laid-Open No. 2000-3980. However, there is a problem since external terminals are formed by etching, it is difficult to manufacture narrow-pitched external terminals due to limitation of side etching quantity control in the etching step. Moreover, when the packaging wiring board is mounted on an external board or device, since stress concentrates on a boundary between the external terminals and the insulator film to cause an open defect, and hence sufficient packaging reliability cannot be attained.

It is therefore an object of the present invention, which has been devised to solve the problems, to provide a semiconductor device mounting board, a method of manufacturing the same, a method of inspecting the same, and a semiconductor package in which by improving a conventional wiring board, the semiconductor device mounting board is capable of implementing a high-density and fine structure corresponding to a narrowing pitch and has high mounting reliability.

DISCLOSURE OF THE INVENTION

To achieve the objects, there are adopted in accordance with the present invention a semiconductor device mounting board, a method of manufacturing the same, a method of inspecting the same, and a semiconductor package as below.

That is, a semiconductor device mounting board in accordance with claim 1 is characterized by comprising a wiring construction film (16) including an insulator layer (14) and a wiring layer (15) alternately laminated thereon, a first electrode pattern (13) in which an electrode pattern is disposed in an insulator layer at an outer-most position on one surface of the wiring construction film, a periphery of a side surface of the electrode pattern is in contact with the insulator layer, at least a surface on the opposite side of the surface of the electrode pattern in contact with the insulator layer is not in contact with the insulator layer, and a boundary between the insulator layer surface and the insulator film is in a plane in which a boundary between the electrode pattern and the insulator film (12) exists;

a second electrode pattern (17) formed in a surface on an opposite side of the surface of the wiring construction film on which the first electrode pattern is formed;

the insulator film in which an opening pattern is disposed below the first electrode pattern; and a metallic supporter (11) disposed in direct contact with the insulator film rear surface.

Additionally, a semiconductor device mounting board in accordance with claim 2 is characterized in that the respective layers of the wiring layer (15) are connected to each other via a first via disposed in the insulator layer (14), and the second electrode pattern (17) is connected via the wiring layer (15) and the first via to the first electrode pattern (13).

Moreover, a semiconductor device mounting board in accordance with claim 3 is characterized in that a conductor pattern (18) is connected to the metallic supporter (11) by the projections (24).

In addition, a semiconductor device mounting board in accordance with claim 14 is characterized in that the projections (24) are formed by one of or a combination of a plating method, etching, conductive pasting, and machining.

Furthermore, a semiconductor package in accordance with claim 15 is characterized by including a semiconductor device mounting board described in one of claims 1 to 14 on which at least one semiconductor device is mounted.

Moreover, a semiconductor package in accordance with claim 16 is characterized in that the semiconductor device is mounted on at least one surface.

Additionally, a semiconductor in accordance with one of claim 17 is characterized in that the semiconductor device is flip-chip connected by either one of fusible metal and conductive resin.

Furthermore, a semiconductor package in accordance with claim 18 is characterized in that the semiconductor device is linked by at least one kind of material selected from a group including fusible metal, conductive resin, and resin mixed with metal.

In addition, a method of manufacturing a semiconductor device mounting board in accordance with claim 19 is characterized by comprising a step of forming a plurality of projections (24) at desired positions on a surface of a metallic supporter (11), a step of forming an insulator film (12) in an area on the surface of the metallic supporter excepting areas in which the projections are formed, a step of forming a first electrode pattern (13) on the insulator film, a step of forming an insulator layer (14) in contact with a periphery of a side surface of the first electrode pattern (13), the insulator layer (14) on the metallic supporter side (11) being in a plane in which a boundary between the first electrode pattern (13) and the insulator film (12) exists, a step of forming a wiring layer (15) on one surface of the first electrode pattern (13) on one side on which the surface is not in contact with the insulator film (12), a step of forming, on a surface of the wiring layer (15) on the opposite side of the insulator layer (14), a wiring construction film (16) by alternately laminating another insulator layer and another wiring layer to each other, the wiring construction film (16) including an insulator layer (15) in an outer-most layer, a step of forming a second electrode pattern (17) on a surface of the wiring construction film (16) on the opposite side of the surface of the wiring construction film (16) on which the first electrode pattern (13) is formed, a step of forming a first opening in the metallic supporter to expose the insulator film and the projections, a step of removing the projections and forming a second opening in the insulator film to expose the first electrode pattern, and a step of shaping a contour of the openings in the insulator film.

Additionally, a method of manufacturing a semiconductor device mounting board in accordance with claim 20 is characterized by comprising a step of forming a plurality of projections (24) at desired positions on a surface of a metallic supporter (11), a step of forming an insulator film (12) in an area on the surface of the metallic supporter excepting areas in which the projections are formed, a step of forming a first electrode pattern (13) on the insulator film, a step of forming a conductor pattern (18) between and in a periphery of the first electrode patterns, a step of forming an insulator layer (14) in contact with a periphery of a side surface of the first electrode pattern (13), the insulator layer (14) on the metallic supporter (11) side being in a plane in which a boundary between the first electrode pattern (13) and the insulator film (12) exists, a step of forming a wiring layer (15) on one surface of the first electrode pattern (13) on one side on which the surface is not in contact with the insulator film (12), a step of forming, on a surface of the wiring layer (15) on the opposite side of the insulator layer (14), a wiring construction film (16) by alternately laminating another insulator layer (14) and another wiring layer (15) to each other, the wiring construction film (16) including an insulator layer (15) in an outer-most layer, a step of forming a second electrode pattern (17) on a surface of the wiring construction film on the opposite side of the surface of the wiring construction film on which the first electrode pattern is formed;

a step of forming a first opening in the metallic supporter to expose the insulator film and the projections, a step of removing the projections and forming a second opening in the insulator film to expose the first electrode pattern, and a step of shaping a contour of the openings in the insulator film.

In addition, a method of manufacturing a semiconductor device mounting board in accordance with claim 21 is characterized by comprising a step of forming a plurality of projections (24) at desired positions on a surface of a metallic supporter (11), a step of forming an insulator film (12) in an area on the surface of the metallic supporter excepting areas in which the projections are formed, a step of forming a first electrode pattern (13) on the insulator film, a step of forming a via in the insulator film to expose part of the metallic supporter;

a step of forming a conductor pattern (18) between and in a periphery of the first electrode patterns so that the conductor pattern (18) is connected to the metallic supporter by the via, a step of forming an insulator layer (14) in contact with a periphery of a side surface of the first electrode pattern (13), the insulator layer (14) on the metallic supporter (11) side being in a plane in which a boundary between the first electrode pattern (13) and the insulator film (12) exists, a step of forming a wiring layer (15) on one surface of the first electrode pattern (13) on one side on which the surface is not in contact with the insulator layer, a step of forming, on a surface of the wiring layer (15) on the opposite side of the insulator layer (14), a wiring construction film (16) by alternately laminating another insulator layer (14) and another wiring layer (15) to each other, the wiring construction film (16) including an insulator layer (14) in an outer-most layer, a step of forming a second electrode pattern (17) on a surface of the wiring construction film (16) on the opposite side of the surface of the wiring construction film on (16) which the first electrode pattern (13) is formed, a step of forming a first opening in the metallic supporter to expose the insulator film and the projections, a step of removing the projections and forming a second opening in the insulator film to expose the first electrode pattern, and a step of shaping a contour of the openings in the insulator film.

Additionally, a method of manufacturing a semiconductor device mounting board in accordance with claim 22 is characterized in that the first electrode pattern is formed in the step equal to the step in which the conductor pattern is formed.

Furthermore, a method of manufacturing a semiconductor device mounting board in accordance with claim 23 is characterized by comprising the step of forming a thin-film condenser on at least one of the first electrode patterns between the step of forming the first electrode pattern and the step of forming the wiring layer (15) on the first electrode pattern.

In addition, a method of manufacturing a semiconductor device mounting board in accordance with claim 24 is characterized by comprising the step, before the step of forming the first electrode pattern, of forming a depression (29) in an area in which the first opening is to be formed.

Moreover, a method of manufacturing a semiconductor device mounting board in accordance with claim 25 is characterized by comprising a step of forming a plurality of projections (24) at desired positions on both surfaces of a metallic supporter (11), a step of forming an insulator film (12) in an area on the both surfaces of the metallic supporter excepting areas in which the projections are formed;

a step of forming a first electrode pattern (13) on the insulator film, a step of forming an insulator layer (14) in contact with a periphery of a side surface of the first electrode pattern (13), the insulator layer (14) on the metallic supporter (11) side being in a plane in which a boundary between the first electrode pattern (13) and the insulator film (12) exists, a step of forming a wiring layer (15) on one surface of the first electrode pattern (13) on one side on which the surface is not in contact with the insulator film (12), a step of forming, on a surface of each of the wiring layers (15) on the opposite side of the insulator layer (14), a wiring construction film (16) by alternately laminating another insulator layer (14) and another wiring layer (15) to each other, the wiring construction film (16) including an insulator layer (14) in an outer-most layer, a step of forming a second electrode pattern (17) on a surface of each of the wiring construction films (16) on the opposite side of the surface of the wiring construction film (16) on which the first electrode pattern (13) is formed, a step of subdividing the metallic supporter into two partitions in a horizontal direction to form a first and second metallic supporters (11b, 11b), a step of forming first openings in the first and second metallic supporters to expose the respective insulator films and the respective projections, a step of removing the projections and forming a second opening in the insulator film to expose the first electrode pattern, and a step of shaping a contour of the openings in the insulator film.

Additionally, a method of manufacturing a semiconductor device mounting board in accordance with claim 26 is characterized by comprising a step of forming a plurality of projections (24) at desired positions on both surfaces of a metallic supporter (11), a step of forming an insulator film (12) in an area on the both surfaces of the metallic supporter excepting areas in which the projections are formed, a step of forming a first electrode pattern (13) on the insulator film, a step of forming a conductor pattern (18) between and in a periphery of the first electrode patterns, a step of forming an insulator layer (14) in contact with a periphery of a side surface of the first electrode pattern (13), the insulator layer (14) on the metallic supporter (11) side being in a plane in which a boundary between the first electrode pattern (13) and the insulator film (12) exists, a step of forming a wiring layer (15) on one surface of the first electrode pattern (13) on one side on which the surface is not in contact with the insulator film (12), a step of forming, on a surface of each of the wiring layers (15) on the opposite side of the insulator layer (14), a wiring construction film (16) by alternately laminating another insulator layer (14) and another wiring layer (16) to each other, the wiring construction film (16) including an insulator layer (14) in an outer-most layer, a step of forming a second electrode pattern (17) on a surface of each of the wiring construction films (16) on the opposite side of the surface of the wiring construction film (16) on which the first electrode pattern (13) is formed, a step of subdividing the metallic supporter into two partitions in a horizontal direction to form a first and second metallic supporters (11a, 11b), a step of forming first openings in the first and second metallic supporters to expose the respective insulator films and the respective projections, a step of removing the projections and forming a second opening in the insulator film to expose the first electrode pattern, and a step of shaping a contour of the openings in the insulator film.

In addition, a method of manufacturing a semiconductor device mounting board in accordance with claim 27 is characterized by comprising a step of forming a plurality of projections (24) at desired positions on both surfaces of a metallic supporter (11), a step of forming an insulator film (12) in an area on the both surfaces of the metallic supporter excepting areas in which the projections are formed, a step of forming a first electrode pattern (13) on the insulator film, a step of forming a via (19) in the insulator film (12) to expose part of the metallic supporter, a step of forming a conductor pattern (18) between and in a periphery of the first electrode patterns so that the conductor pattern (18) is connected to the metallic supporter by the via, a step of forming an insulator layer (14) in contact with a periphery of a side surface of the first electrode pattern (13), the insulator layer (14) on the metallic supporter (11) side being in a plane in which a boundary between the first electrode pattern (13) and the insulator film (12) exists, a step of forming a wiring layer (15) on one surface of the first electrode pattern (13) on an opposite side of the insulator layer (14);

a step of forming, on a surface of the wiring layer (15) on the opposite side of the insulator layer (14), a wiring construction film (16) by alternately laminating another insulator layer (14) and another wiring layer (15) to each other, the wiring construction film (16) including an insulator layer (14) in an outer-most layer, a step of forming a second electrode pattern (17) on a surface of the wiring construction film (16) on the opposite side of the surface of the wiring construction film (16) on which the first electrode pattern (13) is formed, a step of subdividing the metallic supporter into two partitions in a horizontal direction to form a first and second metallic supporters (11a, 11b), a step of forming first openings in the first and second metallic supporters to expose the respective insulator films and the respective projections, a step of removing the projections and forming a second opening in the insulator film to expose the first electrode pattern, and a step of shaping a contour of the openings in the insulator film.

Moreover, a method of manufacturing a semiconductor device mounting board in accordance with claim 28 is characterized by comprising a step of fixing first and second metallic supporters to each other, a step of forming a plurality of projections (14) at desired positions on surfaces of the first and second metallic supporters (11a, 11b), the surfaces not being fixed to each other, a step of forming insulator films (12) in areas on the surfaces of the first and second metallic supporters excepting areas in which the projections are formed, the surfaces not being fixed to each other, a step of forming first electrode patterns (13) on the respective insulator films of the first and second metallic supporters, a step of forming insulator layers (14) in contact with peripheries of side surfaces of the respective first electrode patterns (13) of the first and second metallic supporters, the insulator layers (14) on the metallic supporter sides being in planes in which boundaries between the first electrode patterns (13) and the insulator films (12) exist, a step of forming a wiring layer (15) on one surface on a side of each of the first electrode patterns (13) of the first and second metallic supporters, the surface on the side not being in contact with the insulator film (12), a step of forming, on a surface of each of the wiring layers (15) on the opposite side of the insulator layer (14), a wiring construction film (16) by alternately laminating another insulator layer (14) and another wiring layer (15) to each other, the wiring construction film (16) including an insulator layer (15) in an outer-most layer, a step of forming second electrode patterns on surfaces of the respective wiring construction films (16) on the opposite sides on which the first electrode patterns are formed;

a step of subdividing the first and second metallic supporters into two partitions in a horizontal direction, a step of forming first openings in the first and second metallic supporters to expose the respective insulator films and the respective projections, a step of removing the projections and forming second openings in the insulator films to expose the first electrode patterns, and a step of shaping a contour of the openings in the insulator films.

Additionally, a method of manufacturing a semiconductor device mounting board in accordance with claim 29 is characterized by comprising a step of fixing first and second metallic supporters to each other, a step of forming a plurality of projections (24) at desired positions on surfaces of the first and second metallic supporters (11a, 11b), the surfaces not being fixed to each other;

a step of forming insulator films (12) in areas on the surfaces of the first and second metallic supporters excepting areas in which the projections are formed, the surfaces not being fixed to each other;

a step of forming first electrode patterns (13) on the respective insulator films of the first and second metallic supporters, a step of forming conductor patterns (18) between and in peripheries of the respective first electrode patterns of the first and second metallic supporters, a step of forming insulator layers (14) in contact with peripheries of side surfaces of the respective first electrode patterns (13) of the first and second metallic supporters, the insulator layers (14) on the metallic supporter sides being in planes in which boundaries between the first electrode patterns (13) and the insulator films (12) exist, a step of forming a wiring layer (15) on one surface of each of the first electrode patterns (13) of the first and second metallic supporters on the opposite side of the insulator layer (14), a step of forming, on a surface of each of the wiring layers (15) on the opposite side of the insulator layer (14), a wiring construction film (16) by alternately laminating another insulator layer (14) and another wiring layer (15) to each other, the wiring construction film (16) including an insulator layer (14) in an outer-most layer, a step of forming second electrode patterns (17) on surfaces of the respective wiring construction films (16) on the opposite sides on which the first electrode patterns (13) are formed, a step of subdividing the first and second metallic supporters into two partitions in a horizontal direction, a step of forming first openings in the first and second metallic supporters to expose the respective insulator films and the respective projections, a step of removing the projections and forming second openings in the insulator films to expose the first electrode patterns, and a step of shaping a contour of the openings in the insulator films.

Furthermore, a method of manufacturing a semiconductor device mounting board in accordance with claim 30 is characterized by comprising a step of fixing first and second metallic supporters to each other, a step of forming a plurality of projections (24) at desired positions on surfaces of the first and second metallic supporters (11a, 11b), the surfaces not being fixed to each other;

a step of forming insulator films (12) in areas on the surfaces of the first and second metallic supporters excepting areas in which the projections are formed, the surfaces not being fixed to each other;

a step of forming first electrode patterns (13) on the respective insulator films of the first and second metallic supporters, a step of forming vias (19) in the respective insulator films to expose part of the first and second metallic supporters;

a step of forming conductor patterns (18) between and in peripheries of the first electrode patterns of the first and second metallic supporters so that the conductor patterns (18) are connected to the metallic supporters by the vias, a step of forming insulator layers (14) in contact with peripheries of side surfaces of the respective first electrode patterns (13) of the first and second metallic supporters, the insulator layers (14) on the metallic supporter (11a, 11b) sides being in planes in which boundaries between the first electrode patterns (13) and the insulator films (12) exist;

a step of forming a wiring layer (15) on one surface of each of the first electrode patterns (13) of the first and second metallic supporters on the opposite side of the insulator layer (14);

a step of forming, on a surface of each of the wiring layers (15) on the opposite side of the insulator layer (14), a wiring construction film (16) by alternately laminating another insulator layer (14) and another wiring layer (15) to each other, the wiring construction film (16) including an insulator layer (14) in an outer-most layer;

a step of forming second electrode patterns (17) on surfaces of the respective wiring construction films (16) on the opposite sides on which the first electrode patterns (13) are formed;

a step of subdividing the first and second metallic supporters into two partitions in a horizontal direction, a step of forming first openings in the first and second metallic supporters to expose the insulator films and the projections, a step of removing the projections and forming second openings in the insulator films to expose the first electrode patterns, and a step of shaping a contour of the openings in the insulator films.

Moreover, a method of manufacturing a semiconductor device mounting board in accordance with claim 31 is characterized by comprising the step, before the step of fixing the first and second metallic supporters (11a, 11b) to each other, of forming depressions (29) in areas in which the first openings are to be formed.

Additionally, a method of manufacturing a semiconductor device mounting board in accordance with claim 32 is characterized by comprising the step of forming a thin-film condenser on at least one of the first electrode patterns between the step of forming the first electrode patterns (13) and the step of forming the wiring layers on the first electrode patterns.

Furthermore, a method of manufacturing a semiconductor device mounting board in accordance with claims 33 is characterized by comprising the step of forming solder balls or connection pins so that the first electrode pattern is connected to desired positions of the second electrode pattern.

In addition, a method of manufacturing a semiconductor device mounting board in accordance with claims 34 is characterized in that the metallic supporters include at least one kind of metal selected from a group including stainless steel, iron, nickel, copper, and aluminum or an alloy of the metal thus selected.

Moreover, a method of manufacturing a semiconductor device mounting board in accordance with claim 35 is characterized in that the projections are formed by one of or a combination of a plating method, etching, conductive pasting, and machining.

Additionally, a method of manufacturing a semiconductor package in accordance with claim 36 is characterized by including a semiconductor device mounting board manufactured in a method described in either one of claims 19 to 35 in which a semiconductor device is connected to at least one surface of the board.

Furthermore, a method of manufacturing a semiconductor package in accordance with claim 37 is characterized in that the semiconductor device is flip-chip connected by either one of fusible metal and conductive resin.

Additionally, a method of inspecting a semiconductor device mounting board in accordance with claim 38 is characterized in that after forming the second electrode pattern on the metallic supporter of a semiconductor mounting board manufactured in a method described in either one of claims 19 to 35 and selectively removing the metallic supporter, the projections are not removed and are used as contact terminals.

Figure 1:
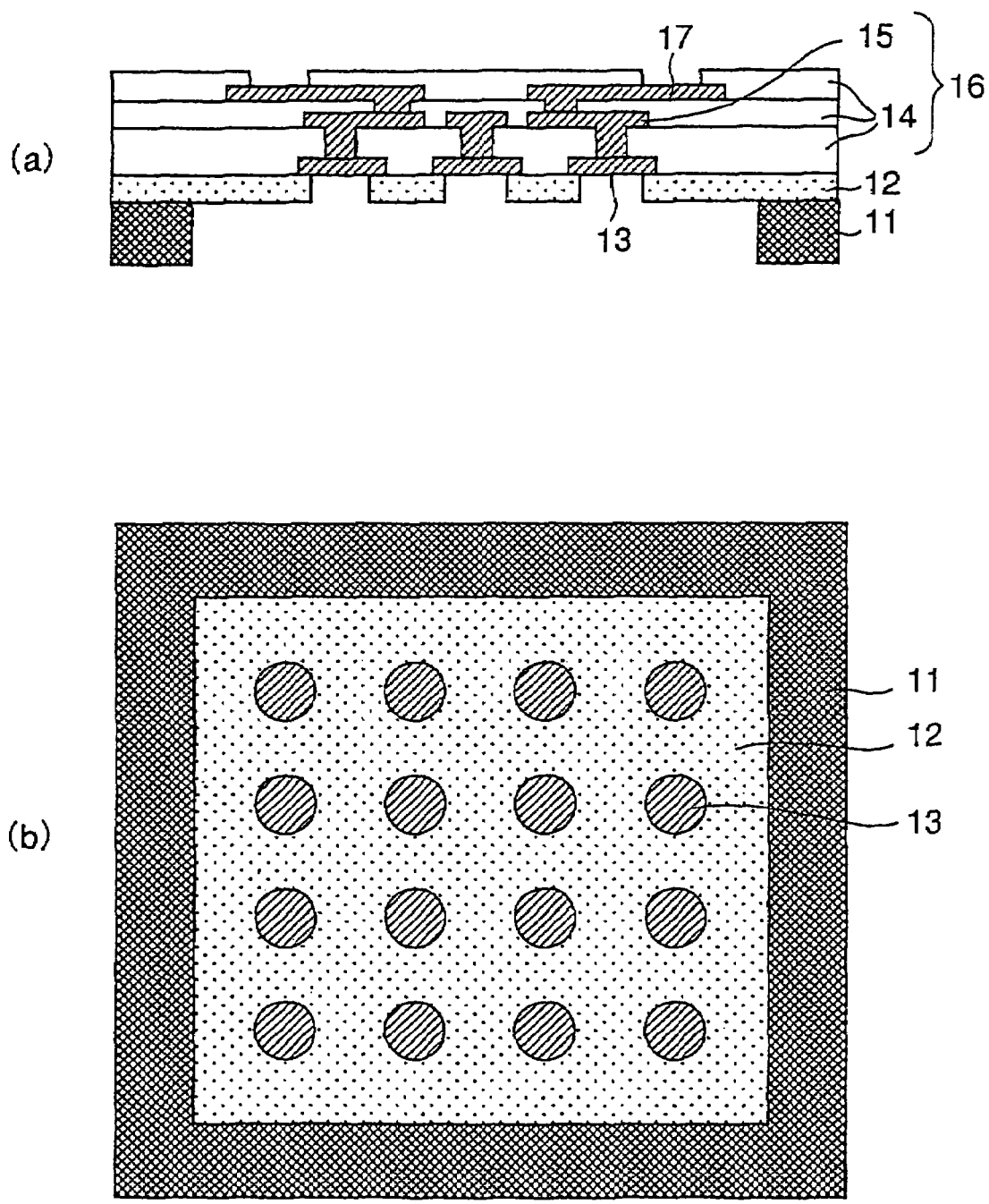
FIG. 1 is a diagram showing a first embodiment of a semiconductor device mounting board and a semiconductor package of the present invention in which (a) is an outline of a cross-sectional view and (b) is an outline of a rear surface viewed from the side of a metallic supporter 11.

A reference numeral 11 is a metallic supporter. A reference numeral 11a is a metallic supporter. A reference numeral 11b is a metallic supporter. A reference numeral 12 is an insulator film. A reference numeral 13 is a first electrode pattern. A reference numeral 14 is an insulating layer. A reference numeral 15 is a wiring layer. A reference numeral 16 is a wiring construction film. A reference numeral 17 is a second electrode pattern. A reference numeral 18 is a conductor pattern. A reference numeral 19 is a via. A reference numeral 20 is a dielectric layer. A reference numeral 21 is a conductor layer. A reference numeral 22 is a condenser. A reference numeral 23 is a solder resist. A reference numeral 24 is a projection. A reference numeral 25 is a semiconductor device. A reference numeral 26 is a pad. A reference numeral 27 is a metallic bump. A reference numeral 28 is an underfill resin. A reference numeral 29 is a depression. A reference numeral 30 is a mold resin. A reference numeral 31 is a spacer. A reference numeral 32 is a heat spreader. A reference numeral 33 is a probe needle.

BEST MODE FOR CARRYING OUT THE INVENTION

Next, by referring to the drawings, description will be given in detail of an embodiment of the present invention. First, description will be given of an embodiment of a semiconductor device mounting board and a semiconductor package in accordance with the present invention. The semiconductor device mounting board will be referred to as "mounting board" hereinbelow when necessary.

Description will be given of a first embodiment of a semiconductor device mounting board and a semiconductor package. FIG. 1 is a diagram showing a configuration of a semiconductor device mounting board in accordance with an embodiment of the present invention in which FIG. 1(a) is an outline of a cross-sectional view and FIG. 1(b) is an outline of a rear surface viewed from the side of the metallic supporter 11.

The mounting board shown in (a) and (b) of FIG. 1 includes a first electrode pattern 13 on one surface of a wiring construction film 16 including an insulating layer 14 and a wiring layer, a second electrode pattern 17 on an opposing surface of the wiring construction film 16, an insulator film 12 on a surface of the first electrode pattern, the surface not being in contact with the wiring construction film 16; and a metallic supporter 11 on a rear surface of the insulator film 12.

The first electrode pattern 13 of the embodiment includes a side periphery in contact with the insulating layers 14 and a rear surface being in a plane in which a rear surface of the insulating layer 14 exists. This means that the first electrode pattern 13 is buried in the insulating layer 14 while the rear surface thereof is not in touch with the insulating layer 14.

The wiring construction film 16 includes a wiring layer 15 including wiring having a predetermined pattern and an insulating material filled in a gap between the wiring and an insulating layer 14 including an insulating material, the wiring layer 15 and an the wiring layer 15 being alternately laminated. The wiring construction film 16 is laminated in a subtractive process, a semi-additive process, or a full-additive process employed in the buildup manufacturing method.

The subtractive process is a method in which a circuit pattern is obtained by etching copper foil on a substrate or a resin as disclosed by Japanese Patent Laid-Open No. Hei 10-51105.

The semi-additive process is a method in which after a power supply layer is formed, electrolytic plating is precipitated in a resist, and then the power supply layer is etched after the resist is removed to form a circuit pattern as disclosed by Japanese Patent Laid-Open Publication No. 9-64493.

The full-additive process is a method in which after a surface of a substrate or a resin is activated, a pattern is formed using a resist and then a circuit pattern is formed in an electroless plating method using the resist as an insulating layer as disclosed by Japanese Patent Laid-Open No. Hei 6-334334.

The insulating layer 14 is formed using one organic resin or, two or more organic resins selected from a group of epoxy resin, epoxy acrylate resin, urethane acrylate resin, polyester resin, phenol resin, polyimide resin, BCB (benzocyclobutene), and PBO (polybenzoxaxole). Particularly, it is favorable to include an insulating material (to be abbreviated as "insulating material A" hereinbelow when necessary) having a film strength of 70 MPa or more, a percentage of elongation ratio at rupture of 5 % or more, a glass transition temperature of 150 degrees Celsius or more, and a thermal expansion coefficient of 60 ppm per degree Celsius or less, or an insulating material (to be abbreviated as "insulating material B" hereinbelow when necessary) having a modulus of elasticity of 10 GPa or more, a thermal expansion coefficient of 30 ppm per degree Celsius or less, and a glass transition temperature of 150 degrees Celsius or more. It is favorable that the insulating layer 14 has a thickness of 8 μm or more.

In this connection, the modulus of elasticity and the percentage of elongation for rupture are measured values by a tension test of insulating material according to JIS K 7161 (tension characteristic test), and the modulus of elasticity is a calculated value using strength with distortion of 0.1% according to a result of the tension text. The thermal expansion coefficient is a measured value obtained using a TMA method according to JIS C 6481, and the glass transition temperature is a measured value obtained using a DMA method according to JIS C 6481.

For the insulating material A, for example, epoxy-based resin (Hitachi Chemical Co., Ltd.; MCF-7000LX), polyimide(s)-based resin (Nitto Electric Industrial Co., Ltd.; AP-6832C), benzocyclobutene resin (Dow Chemical; Cyclotene 4000 Series), polyphenylene ether resin (Asahi Chemical Industry Co., Ltd.; Xylon), a liquid-crystal polymer film (Kuraray Co., Ltd.; LCP-A), and drawn porous fluorine resin saturating thermoset resin (Japan Goatex; MICROLAM 600) are suitable.

For the insulating material B, for example, glass cloth saturating epoxy resin (Hitachi Chemical Industry Co., Ltd.; MCL-E-679), aramid non-woven fabric saturating epoxy resin (Shin-Kobe Electric Machinery Co., Ltd.; EA-541), and drawn porous fluorine resin saturating thermoset resin (Japan Goatex; MICROLAM 400) are suitable.

As for the insulating layer 14, either one of these organic resins may be used for all insulating layers 14 between the wiring layers 15 or two or more layers of the above-described organic resins may be mixedly arranged between the wiring layers 15. In the embodiment, the insulating layer 14 is formed using, for example, polyimide resin. However, it is also possible that the lower-most insulating layer 14 is formed by using, for example, polyimide resin and the second subsequent layers are formed by using epoxy resin.

For the metal to construct wiring in the wiring layer 15, copper is optimal from a viewpoint of cost. However, it is also possible to use at least one metal selected from a group of gold, silver, aluminum, and nickel or an alloy of the selected metal(s). In the embodiment, the wiring of the wiring layer 15 includes copper.

The insulator film 12 is in contact with a rear surface of the first electrode pattern 13, and an opening exists in the insulator film 12 to be within the first electrode pattern. Moreover, a metallic supporter 11 is disposed on a rear surface of the insulator film 12 to function as solder resist. As the material of the insulator film 12, any insulating material having a function as solder resist is available without any problem. Additionally, the material used for the insulator film 14 can also be applied to the insulator film 12.

Moreover, the second electrode pattern 17 is connected to the higher-most layer of the wiring layer 15, the layers of the wiring layer 15 are connected via a via in the insulating layers 14 to each other, and the lower-most layer of the wiring layer 15 is connected via a via in the insulating layers 14 to the first electrode pattern 13.

Figure 2:
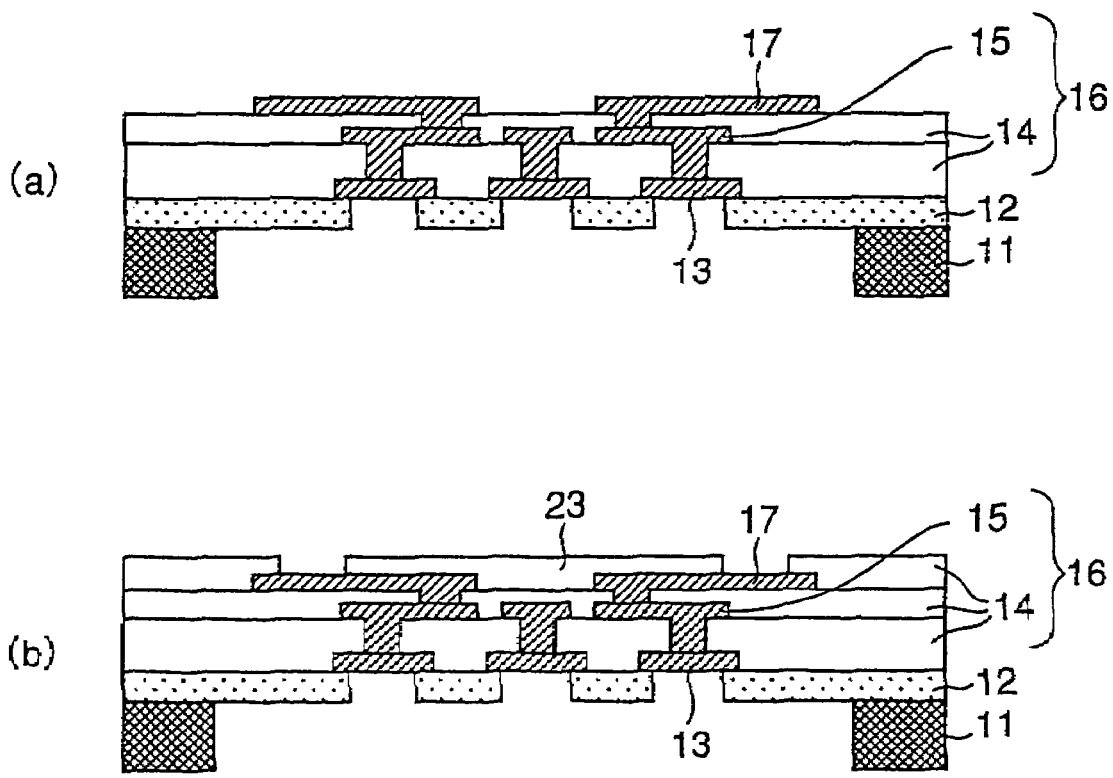
FIG. 2 is an outline of a cross-sectional view showing a variation of the first embodiment of a semiconductor device mounting board and a semiconductor package of the present invention.

Although in the form of FIG. 1(a), the second electrode pattern 17 is formed in the insulating layers 14, the second electrode pattern 17 can also be formed on the insulating layers 14 without any problem as shown in FIG. 2(a). Furthermore, as shown in FIG. 2(b), the solder resist 23 may be disposed on the second electrode pattern 17 formed on the insulating layers 14.

The metallic supporter 11 is disposed to strengthen the mounting board. By disposing the metallic supporter 11 for the mounting board, it is possible to suppress deformation such as the warp and the undulation of the mounting board to guarantee mounting reliability when mounting semiconductor devices on the mounting board and packaging reliability when installing a mounting board or a semiconductor package onto an external board. The metallic supporter 11 may be disposed in the contour of, in addition to a frame shown in FIG. 1(a), a lattice or a mesh only if the first electrode pattern 13 is exposed.

The metallic supporter 11 is desirably made of a metal which can add sufficient strength to the mounting board and which has heat resistivity capable of resisting against thermal treatment in a packaging process of a mounting board or a semiconductor package.

The material of the metallic supporter 11 may be at least one metal selected from a group of stainless steel, iron, nickel, copper, and aluminum, or an alloy of the selected metal(s). However, stainless steel and a copper alloy are optimal in consideration of handling thereof. Moreover, the metallic supporter 11 has an optimal thickness of from 0.1 to 1.5 mm. The metallic supporter 11 is made of metal and has conductivity and hence it is possible to supply electric power thereto.

In accordance with the present invention, since the first electrode pattern 13 is buried in the insulating layers 14, stress to and distortion of the first electrode pattern 13 are mitigated and concentration of stress can be reduced, and since the insulator film 12 functions as solder resist, positioning errors of balls can be prevented in the setting of solder balls and hence workability can be increased. Thanks to these advantages, concentration of stress to a junction reduced after the setting, and there can be obtained a mounting board having high setting stability and high packaging reliability with respect to an external board.

Figure 3:
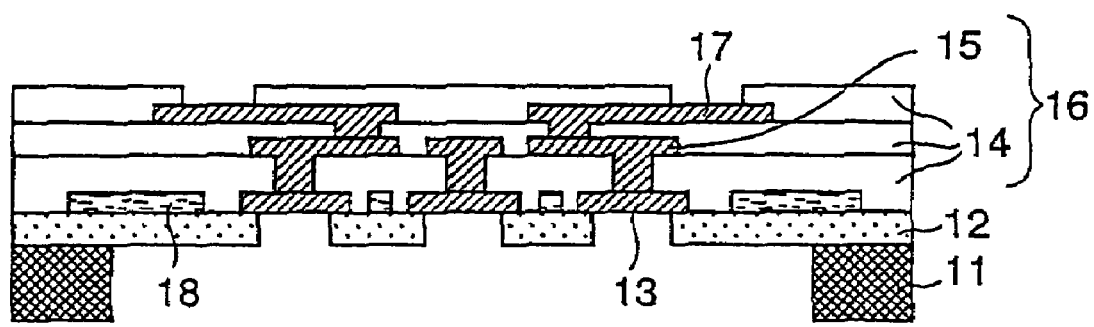
FIG. 3 is an outline of a cross-sectional view showing a second embodiment of a semiconductor device mounting board and a semiconductor package of the present invention.

Next, description will be given of a second embodiment of a mounting board and a semiconductor package in accordance with the present invention. FIG. 3 is an outline of a cross-sectional view showing a configuration of a semiconductor device mounting board in accordance with the embodiment. Excepting that a conductor pattern 18 is disposed between and in a periphery of the first electrode patterns 13 and the conductor pattern 18 is connected via a via to a wiring layer 15 in a wiring construction film 16, the configuration of FIG. 3 is equal to that of the mounting board of the first embodiment.

For the metal to construct the conductor pattern 18, copper is optimal from a viewpoint of cost. However, it is also possible to use at least one metal selected from a group of gold, silver, aluminum, and nickel or an alloy of the selected metal (s). In the embodiment, wiring in the conductor pattern 18 includes copper.

Figure 4:
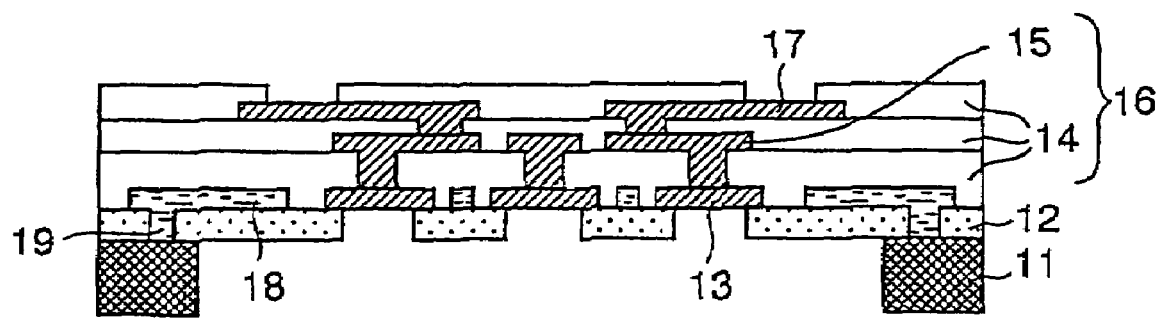
FIG. 4 is an outline of a cross-sectional view showing a variation of the second embodiment of a semiconductor device mounting board and a semiconductor package of the present invention.

Additionally, as shown in FIG. 4, since the metallic supporter 11 includes metal and can be electrically used, the circuit can also be configured such that the conductor pattern 18 is connected via the via 19 to the metallic supporter 11.

In accordance with the present invention, since there is included the insulator film 12, it is possible to dispose an electric circuit (particularly, a power source and ground) using the conductor pattern 18 in a stable state in a plane in which the first electrode pattern 13 is formed. Therefore, the number of degrees of freedom increases and electric characteristics can be improved, which hence leads to an advantage that the number of laminated layers can be reduced when the mounting board includes many layers.

Figure 5:
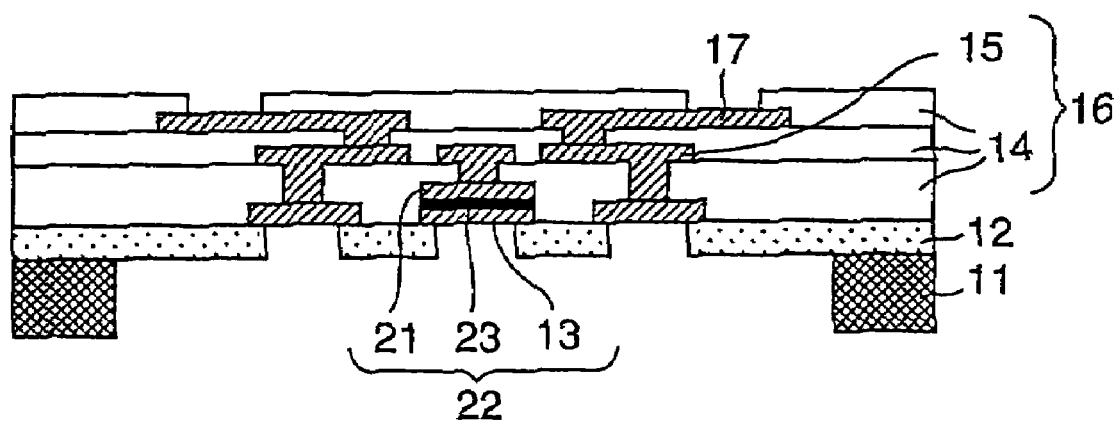
FIG. 5 is an outline of a cross-sectional view showing a third embodiment of a semiconductor device mounting board and a semiconductor package of the present invention.

Next, description will be given of the third embodiment of the mounting board in accordance with the present invention. FIG. 5 is an outline of a cross-sectional view showing a configuration of a semiconductor device mounting board in accordance with the present invention. Excepting that the configuration includes a capacitor 22 including a dielectric layer 20 disposed on an upper surface of the first electrode pattern 13 and a conductor layer 21 on an upper surface of the dielectric layer 20, the conductor layer 21 being electrically connected to the wiring construction film 16; the mounting board is equal to that of the first or second embodiment.

The dielectric layer 20 of the capacitor 22 is formed by a sputtering method, an evaporation method, CVD or an anode oxidation method, or the like. The materials constituting the capacitor 22 are favorably perovskite-based material such as titanium oxide, tantalum oxide, $Al_2O_3$, $SiO_2$, $Nb_2O_5$, and BST ($Ba_xSr_{1-x}TiO_3$), PZT ($PbZr_xTi_{1-x}O_3$), PLZT ($Pb_{1-y}La_yZr_xTi_{1-x}O_3$) and $SrBi_2Ta_2O_9$. However, 0.x. 1 and $0<y<1$ hold for any one of these compounds. Moreover, the capacitor 22 may include an organic resin or the like capable of achieving a desired dielectric constant.

In accordance with the present invention, by configuring such a condenser, transmission noise can be reduced, and there can be obtained a mounting board optimal to increase the operation speed.

Figure 6:
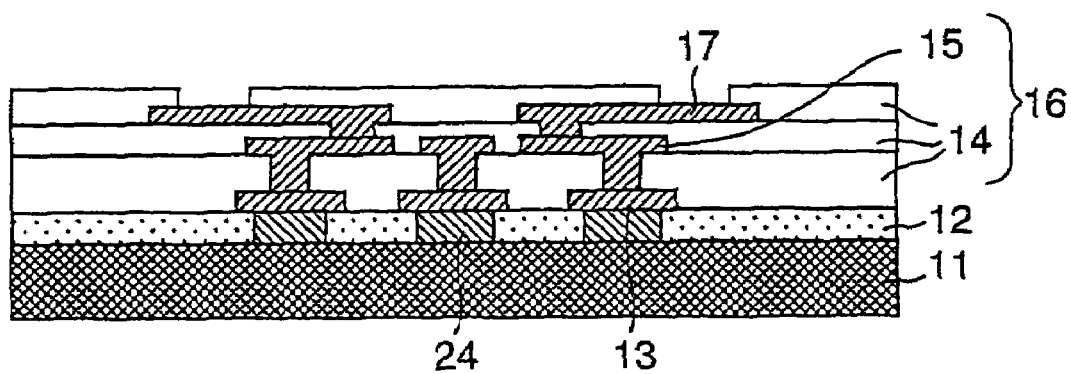
FIG. 6 is an outline of a cross-sectional view showing a fourth embodiment of a semiconductor device mounting board and a semiconductor package of the present invention.

Next, description will be given of a fourth embodiment of a mounting board and a semiconductor package in accordance with the present invention. FIG. 6 is an outline of a cross-sectional view showing a configuration of a semiconductor device mounting board in accordance with the embodiment. Excepting that the metallic supporter 22 includes a projection 24 and is disposed on the entire rear surface of the insulator film 12 and an upper section of the projection 24 is in contact with the first electrode pattern 13, the mounting board is equal to that of the first, second, or third embodiment.

The projection 24 is formed by one of or a combination of a plating method, etching, conductive pasting, and machining. Additionally, as shown in (a) and (b) of FIG. 7, in the mounting board including the conductor pattern 18, it is also possible to configure such that the metallic supporter 11 is electrically connected via the projection 24 to the conductor pattern 18.

In this configuration, it is required that the projection 24 is connected to the conductor pattern 18 in an electrically stable state. Furthermore, even in a configuration in which the metallic supporter 11 shown in FIG. 7(b) is removed and an opening is disposed in the insulator film 12, it is also possible to configure such that the metallic supporter 11 is electrically connected via the projection 24 to the conductor pattern 18.

In accordance with the present invention, electric conduction is guaranteed between the metallic supporter 11, the first electrode pattern 13, and the conductor pattern 18 and it is hence possible to conduct a circuit open test for the mounting board. Moreover, since the metallic supporter 11 is disposed on the overall rear surface of the mounting board, in the mounting of semiconductor devices using solder balls, fusible metal, wire bonding, or the like to establish electric conduction to the second electrode pattern 17 of the mounting board; flatness of the mounting board is more sufficiently guaranteed and hence mounting reliability of a semiconductor device can be improved. Additionally, when the overall rear surface is used for the metallic supporter 11, it is not possible to determine quality of the mounting board before the mounting of a semiconductor device thereon. Therefore, in order that only necessary projections 24 are not brought into contact with the metallic supporter 11, the metallic supporter 11 is selectively removed to expose the projections 24 to be used for the test.

By using this method, it is possible to determine quality of the mounting board while guaranteeing the flatness by the metallic supporter 11; furthermore, by using the projections 24, it is possible to prevent the damage of the first electrode pattern 13 at the removal of the metallic supporter 11. Additionally, regardless of whether or not the method of determining the quality is used, the first electrode pattern 13 can be exposed by selectively removing the metallic supporter 11 and the projections 24 in a shape of a frame or the like after the semiconductor package is formed. As for the removal of the metallic supporter 11, if the semiconductor package to be formed has strength without the metallic supporter 11 to guarantee sufficient mounting reliability onto an external board, the metallic supporter 11 may be completely removed.

Figure 8:
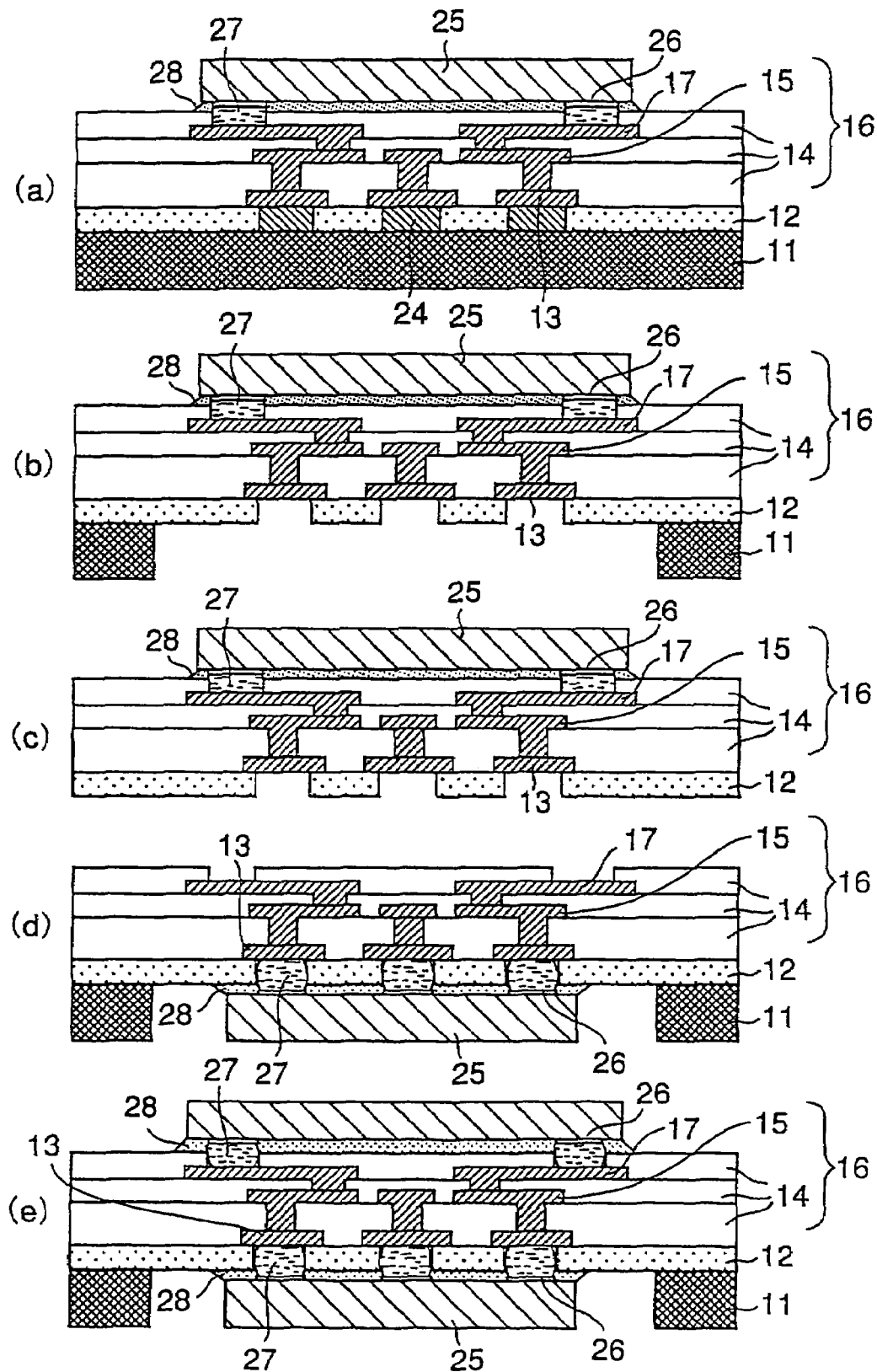
FIG. 8 is an outline of a cross-sectional view showing a fifth embodiment of a semiconductor device mounting board and a semiconductor package of the present invention.

Next, description will be given of a fifth embodiment of a mounting board and a semiconductor package in accordance with the present invention. FIG. 8 is an outline of a cross-sectional view showing a configuration of a semiconductor package in a flip chip in accordance with this embodiment.

The semiconductor package of the present invention can be constructed by mounting a semiconductor device 25 on the mounting board described in the first, second, third, or fourth embodiment of the present invention. Electric connecting sections such as a pad of semiconductor device 25 can be electrically connected to the wiring of the mounting board in various methods, for example, a flip chip, wire bonding, and tape bonding can be used.

The semiconductor package of the present invention can be configured to include the metallic supporter 11 on the overall rear surface of the mounting board as shown in FIG. 8(a). When mounting the package of the configuration on another board or the like, the metallic supporter 11 and the projections 24 are removed to expose the first electrode pattern 13. In the configuration in which the first electrode pattern 13 is exposed, the metallic supporter 11 is machined in the shape of a frame, a lattice, or a mesh on the rear surface of the insulator film 12 so that the remained section reinforces the semiconductor package as shown in FIG. 8(b). When sufficient strength is provided even if such reinforcement is not formed, the metallic supporter 11 may be entirely removed in a configuration shown in FIG. 8(c).

Furthermore, as shown in FIG. 8(d), there may also be used a configuration in which after the first electrode pattern 13 is exposed by selectively removing the metallic supporter 11, the semiconductor device 25 is mounted on the first electrode pattern 13. In this case, the metallic supporter 11 has a function to reinforce the semiconductor package and a function to suppress the warp and the undulation of the mounting board in a state in which tension is kept applied to the insulator film 12 and the wiring construction film 16. Additionally, the semiconductor device 25 may be mounted on both sides of the mounting board if necessary as shown in FIG. 8(e).

Moreover, in the semiconductor package of the present invention, the pads 26 disposed in the semiconductor device 25 can be electrically connected, for example, via an electric bump 27 to the first electrode pattern 13 or the second electrode pattern 17 of the mounting board of the present invention as shown in FIG. 8. In this case, an underfill resin 28 can be filled in a gap between the semiconductor device 25 and the mounting board according to necessity.

Additionally, there may also be used a configuration in which the semiconductor device 25 is sealed up by a mold resin 30 and in which a heat spreader 32 and a heat sink are attached to the semiconductor device 25 to increase heat radiation. Moreover, when the semiconductor device 25 is mounted on the first electrode pattern 13, the metallic supporter 11 may be used as a spacer 31 for the heat sink.

Next, description will be given of an embodiment of a method of manufacturing a semiconductor device mounting board and a semiconductor package in accordance with the present invention. FIGS. 9(a) to 9(f) are partial cross-sectional views showing, in a process sequence, a method of manufacturing a semiconductor device mounting board in accordance with the first embodiment of the present invention. The embodiment is used to manufacture a mounting board in accordance with the first embodiment of the present invention. In this connection, rinsing and heat treatment are conducted between the processes according to necessity.

Figure 9:
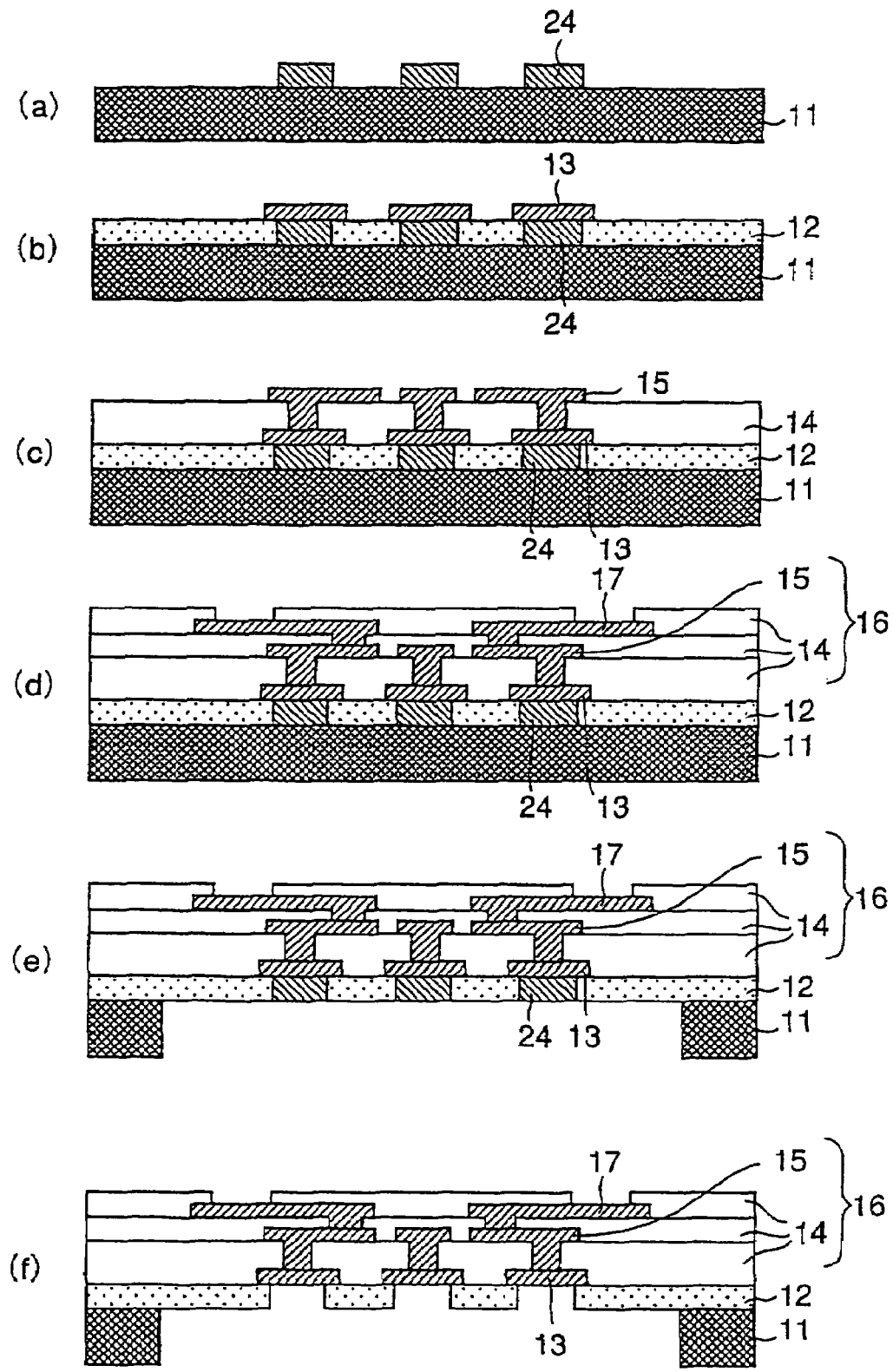
FIG. 9 is a partial cross-sectional view showing a first embodiment of a method of manufacturing a semiconductor device mounting board and a semiconductor package of the present invention.

First, projections 24 are formed on a surface of the metallic supporter 11 with a thickness ranging from 0.1 mm to 1.5 mm using one of or a combination of a plating method, etching, conductive pasting, and machining as shown in FIG. 9(a). As an etching barrier for the first electrode pattern 13 in the removal of the projections 24 by etching, it is also possible to form an upper-most layer of the projections 24 with one of metals such as gold, silver, platinum, and palladium.

In the embodiment, a plate of a copper alloy (Kobe Steel, Ltd.; KFC series) is used for the metallic supporter 11 and the projections 24 are formed by plating nickel. In the method of forming the projections 24, a 30 .m thick plating resist layer is formed on the metallic supporter 11, resist opening patterns are formed in areas for the projections 24 by photolithography techniques including exposure and development or by a laser, and then 25 .m thick electrolyte nickel plating is precipitated.

Next, the insulator film 12 and the first electrode pattern 13 are formed as shown in FIG. 9(b). In the forming of the insulator film 12, when the resin for the insulator film 12 is liquid state, a layer of the insulator resin is formed by a spin coat method, a dye coat method, a curtain coat method, or a printing method. Moreover, when a dry film or a copper foil with resin is used, the film or foil is laminated by a laminating method or the like and then a process of heat treatment is conducted for the layer to stiffen the layer. In the operation, it is required that the top of the projection 24 appears on the surface of the insulator film 12. Therefore, for a liquid resin, a patterning process is conducted by photolithography if the resin is photosensitive. The resin is shaped by polishing if the resin is non-photosensitive or even if the resin is photosensitive when resolution of the resin is not sufficient.

In addition, for the dry film or the copper foil with resin, it is favorable to dispose a cushion on the film carrier side so that the top of the projection 24 appears in the lamination process. In a case of a dry film, it is also possible to shape the dry film by polishing after the laminating process.

After the insulator film 12 is formed, the first electrode pattern 13 is formed by a subtractive process, a semi-additive process, a fully-additive process, or the like. Particularly, when a resin of the copper foil with resin is used as the insulator film 12, the copper foil used as a carrier may be patterned by the subtractive process.

Furthermore, when the copper foil is thin, i.e., has a thickness of 2 .m or less, the patterning may be conducted in the semi-additive process using the copper foil as a power supply layer. In the embodiment, the insulator film 12 is formed using a copper foil with resin (Sumitomo Bakelite Co., Ltd.; APL-4501; copper foil thickness, 18 .m) and the first electrode pattern 13 is formed by patterning the copper foil in the subtractive process.

Subsequently, the insulating layer 14 and the wiring layer 15 are formed as shown in FIG. 9(c). In the forming of the insulating layer 14, when the resin for the insulating layer 14 is liquid state, a layer of the insulator resin is formed by a spin coat method, a dye coat method, a curtain coat method, or a print method. Moreover, when the insulator resin is a dry film, the insulator resin is laminated by a laminating method or the like and then a process of heat treatment is conducted for the layer to stiffen the layer.

Additionally, the insulator resin is patterned to form a via hole in a photolithography process or the like if the insulator resin is photosensitive and by laser machining or the like if the insulator resin is not photosensitive. The insulator resin is cured to be stiffened to thereby form the insulating layer 14. Next, the wiring pattern is formed in a subtractive process, a semi-additive process, a fully-additive process, or the like to form the wiring layer 15.

Next, as shown in FIG. 9(d), the process to form the insulating layer 13 and the process to form the wiring layer 14 in a subtractive process, a semi-additive process, a fully-additive process, or the like are repeatedly conducted to form the wiring construction film 16 and the second electrode pattern 17 in the surface layer. In the embodiment, aramid nonwoven fabric saturating epoxy resin (Shin-Kobe Electric Machinery Co., Ltd.; EA-541) is employed for the insulator resin 13, and the wiring layer 14 is formed in a semi-additive process using 2-.m thick electroless copper plating as a power supply layer.

Next, the metallic supporter 11 is selectively removed by etching as shown in FIG. 9(e). For the removing method, etching resist is formed with openings for the etching. In the forming method, when the etching resist is liquid, an etching resist layer is formed by a spin coat method, a dye coat method, a curtain coat method, or a print method. When the etching resist is a dry film, an etching resist layer is formed by a laminating method or the like, and then a process of heat treatment is conducted to stiffen the etching resist. The etching resist is patterned in a photolithography process when the etching resist is photosensitive and by laser machining when the etching resist is not photosensitive.

Thereafter, using the etching resist as a mask, the metallic supporter 11 is etched until the insulator film 11 and the projections 24 are exposed. In the embodiment, the copper alloy plate is selectively removed using alkali copper etching solution including ammonia as a main component (Meltex; A Process).

Next, the projections 24 are etched or are selectively removed by laser as shown in FIG. 9(f). Laser may be used to shape the contour of the opening after the etching. After removing the projections 24, the exposed surface of the first electrode pattern 13 is normalized to obtain a mounting board. In the embodiment, nickel used for the projections 24 are removed by etching solution including mixture of sulfuric acid:hydrogen peroxide solution:deionized water=1:1:10.

The mounting board is the same as the mounting board in accordance with the first embodiment of the present invention. Using the manufacturing method described above, the mounting board can be efficiently manufactured. In the manufacturing method of the present embodiment, since the wiring construction film 16 is laminated using a flat metallic supporter 11 as a substrate, flatness of the wiring construction film 16 can be improved. Therefore, a stable lamination is possible.

Furthermore, the mounting board can be formed without forming the projections 24. However, as described for the advantage of the mounting board shown in the fourth embodiment of the present invention, it is not possible to determine quality of the mounting board before the semiconductor device is mounted on the second electrode pattern 17 by use of flatness of the metallic supporter 11. Since the determination of quality is essential for the mounting board, it is not possible in the method not using the projections 24 to mount the semiconductor device by use of flatness of the metallic supporter 11.

Subsequently, description will be given of a second embodiment of a method of manufacturing a semiconductor device mounting board and a semiconductor package in accordance with the present invention. FIG. 10(a) to FIG. 10(d) are partial cross-sectional views showing, in a process sequence, a method of manufacturing a mounting board in accordance with the second embodiment of the present invention.

The embodiment is used to manufacture a mounting board in accordance with the second embodiment of the present invention (FIG. 3). In this connection, rinsing and heat treatment are conducted between the processes according to necessity. Excepting that a conductor pattern 18 is disposed between and in a periphery of the first electrode patterns 13 and the conductor pattern 18 is connected via a via to the wiring layer 15 in the wiring construction film 16, the configuration is equal to that of the method of manufacturing a mounting board in the first embodiment of the present invention.

First, as shown in FIG. 10(a), on a surface of the metallic supporter 11 with thickness ranging from 0.1 to 1.5 mm, the projections 24 are formed by one of or a combination of a plating method, etching, conductive pasting and machining. As an etching barrier for the first electrode pattern 13 in the removal of the projections 24 by etching, it is also possible to form an upper-most layer of the projections 24 with one of metals such as gold, silver, platinum and palladium.

In the embodiment, a plate of a copper alloy (Kobe Steel, Ltd.; KFC series) is used for the metallic supporter 11 and the projections 24 are formed by plating nickel. In the method of forming the projections 24, a 30 .m thick plating resist layer is formed on the metallic supporter 11, resist opening patterns are formed in areas for the projections 24 by photolithography techniques including exposure and development or by a laser, and then 25 .m thick electrolyte nickel plating is precipitated.

Next, the insulator film 12 and the first electrode pattern 13 are formed as shown in FIG. 10(b). In the forming of the insulator film 12, when the resin for the insulator film 12 is liquid, a layer of the insulator resin is formed by a spin coat method, a dye coat method, a curtain coat method, or a print method. Moreover, when a dry film or a copper foil with resin is used, the film or foil is laminated by a laminating method or the like and then a process of heat treatment is conducted for the layer to stiffen the layer. In the operation, it is required that the top of the projection 24 appears on the surface of the insulator film 12. Therefore, for a liquid resin, a patterning process is conducted by photolithography if the resin is photosensitive. The resin is shaped by polishing if the resin is non-photosensitive or even if the resin is photosensitive when resolution of the resin is not sufficient.

In addition, for the dry film or the copper foil with resin, it is favorable to dispose a cushion on the film carrier side so that the top of the projection 24 appears in the lamination process. In a case of a dry film, it is also possible to shape the dry film by polishing after the laminating process.

After the insulator film 12 is formed, the first electrode pattern 13 is formed by a subtractive process, a semi-additive process, a fully-additive process, or the like. Particularly, when a resin of the copper foil with resin is used as the insulator film 12, the copper foil used as a carrier may be patterned by the subtractive process.

Furthermore, when the copper foil is thin, i.e., has a thickness of 2 .m or less, the patterning may be conducted in the semi-additive process using the copper foil as a power supply layer. In the embodiment, the insulator film 12 is formed using a copper foil with resin (Sumitomo Bakelite Co., Ltd.; APL-4501; copper foil thickness, 18 .m) and the first electrode pattern 13 is formed by patterning the copper foil in the subtractive process.

Next, the conductor pattern 18 is formed between and in the periphery of the first electrode patterns 13 as shown in FIG. 10(c). The conductor pattern 18 is formed in a subtractive process, a semi-additive process, a fully-additive process, or the like. In the embodiment, after the first electrode patterns 13 is formed, 2-.m thick electroless copper plating is precipitated, and then the conductor pattern 18 is formed in the semi-additive process using the copper plating as a power supply layer.

Subsequently, the insulating layer 14 and the wiring layer 15 are formed as shown in FIG. 10(d). In the forming of the insulating layer 14, when the resin for the insulating layer 14 is liquid, a layer of the insulator resin is formed by a spin coat method, a dye coat method, a curtain coat method, or a print method. Moreover, when the insulator resin is a dry film, the insulator resin is laminated by a laminating method or the like and then a process of heat treatment is conducted for the layer to stiffen the insulator resin.

Additionally, the insulator resin is patterned to form a via hole in a photolithography process or the like if the insulator resin is photosensitive and by laser machining or the like if the insulator resin is not photosensitive. The insulator resin is cured to be stiffened to thereby form the insulating layer 14.

Next, the wiring pattern is formed in a subtractive process, a semi-additive process, a fully-additive process, or the like to form the wiring layer 15. In the embodiment, aramid nonwoven fabric saturating epoxy resin (Shin-Kobe Electric Machinery Co., Ltd.; EA-541) is employed for the insulator resin 13, and the wiring layer 14 is formed in a semi-additive process using 2 .m thick electroless copper plating as a power supply layer. Processes after this point are the same as those after FIG. 9(d) in the first embodiment of the present invention.

Figure 10:
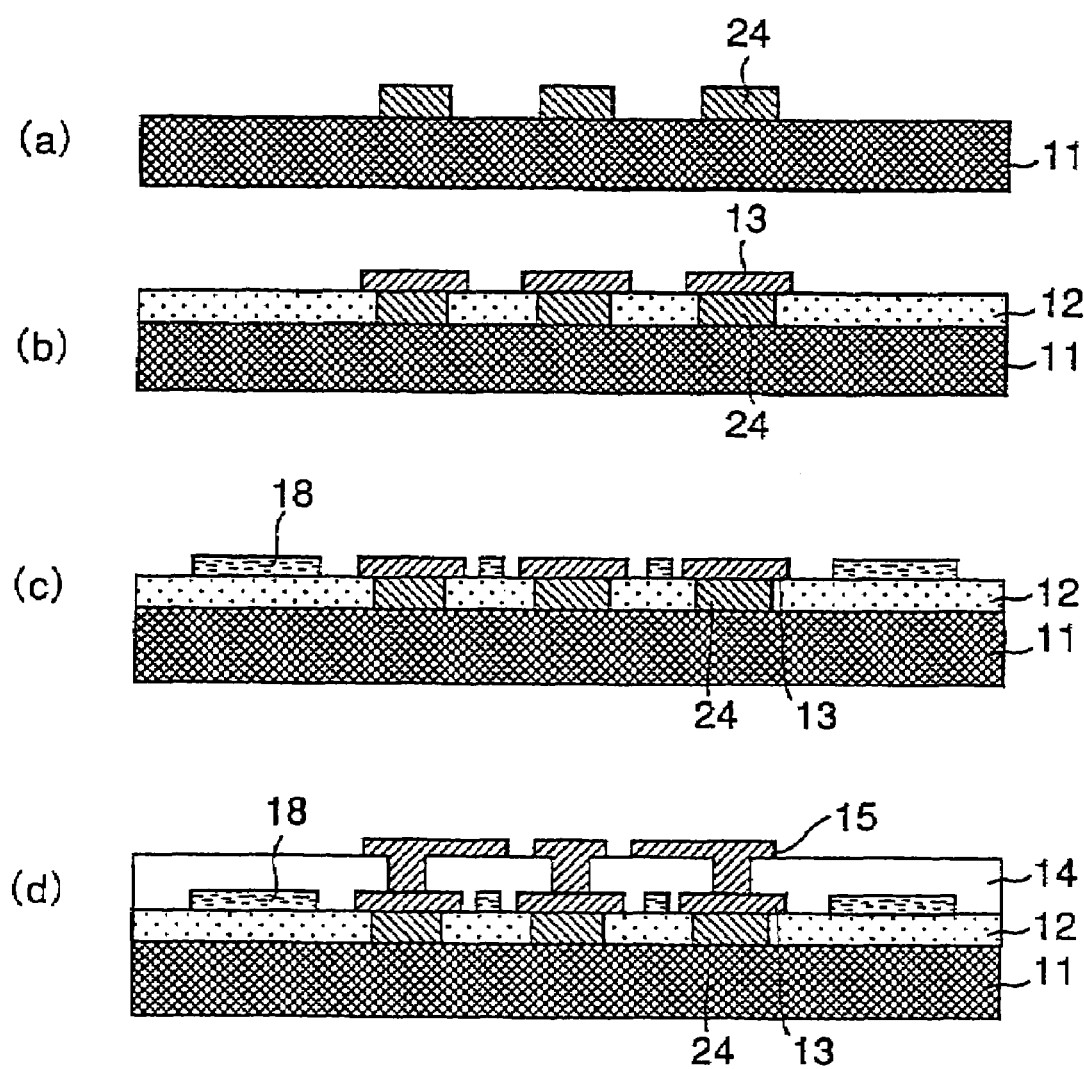
FIG. 10 is a partial cross-sectional view showing a second embodiment of a method of manufacturing a semiconductor device mounting board and a semiconductor package of the present invention.
Figure 11:
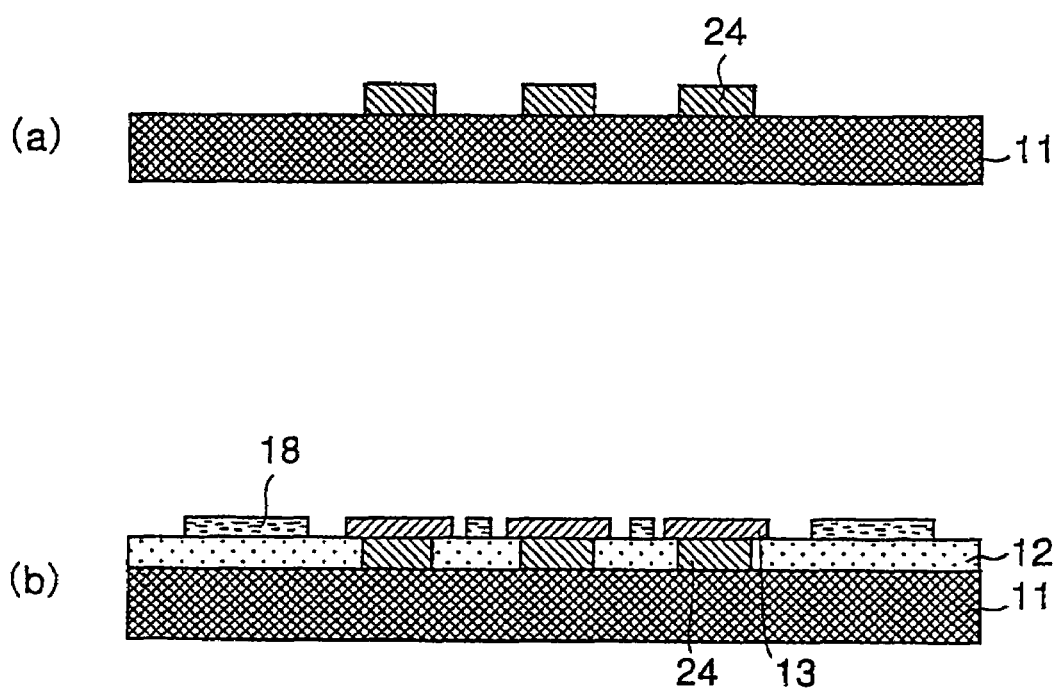
FIG. 11 is a partial cross-sectional view showing a variation of the second embodiment of a method of manufacturing a semiconductor device mounting board and a semiconductor package of the present invention.

On the other hand, as shown in FIGS. 11(a) and 11(b), the first electrode pattern 13 and the conductor pattern 18 may be formed at the same time. FIG. 11 shows only the processes which are different from those of FIG. 10. In this method, there are obtained an advantage in which aligning precision between the first electrode pattern 13 and the conductor pattern 18 is improved and an advantage in which the number of processes is decreased to reduce the cost.

First, as shown in FIG. 11(a), on a surface of the metallic supporter 11 with thickness ranging from 0.1 to 1.5 mm, the projections 24 are formed by one of or a combination of a plating method, etching, conductive pasting, and machining. As an etching barrier for the first electrode pattern 13 in the removal of the projections 24 by etching, it is also possible to form an upper-most layer of the projections 24 with one of metals such as gold, silver, platinum and palladium.

In the embodiment, a plate of a copper alloy (Kobe Steel, Ltd.; KFC series) is used for the metallic supporter 11 and the projections 24 are formed by plating nickel. In the method of forming the projections 24, a 30 .m thick plating resist layer is formed on the metallic supporter 11, resist opening patterns are formed in areas for the projections 24 by photolithography techniques including exposure and development or by a laser, and then 25 .m thick electrolyte nickel plating is precipitated.

Next, the insulator film 12, the first electrode pattern 13, and the conductor pattern 18 are formed as shown in FIG. 11(b). In the forming of the insulator film 12, when the resin for the insulator film 12 is liquid, a layer of the insulator resin is laminated by a spin coat method, a dye coat method, a curtain coat method, or a print method. Moreover, when a dry film or a copper foil with resin is used, the film or foil is laminated by a laminating method or the like and then a process of heat treatment is conducted for the layer to stiffen the layer. In the operation, it is required that the top of the projection 24 appears on the surface of the insulator film 12. Therefore, for a liquid resin, a patterning process is conducted by photolithography if the resin is photosensitive. The resin is shaped by polishing if the resin is non-photosensitive or even if the resin is photosensitive when resolution of the resin is insufficient.

In addition, for the dry film or the copper foil with resin, it is favorable to dispose a cushion on the film carrier side so that the top of the projection 24 appears in the lamination process.

In a case of a dry film, it is also possible to shape the dry film by polishing after the laminating process.

After the insulator film 12 is formed, the first electrode pattern 13 and the conductor pattern 18 are formed by a subtractive process, a semi-additive process, a fully-additive process, or the like. Particularly, when a resin of the copper foil with resin is used as the insulator film 12, the copper foil used as a carrier may be patterned by the subtractive process. Furthermore, when the copper foil is thin, i.e., has a thickness of 2 .m or less, the patterning may be conducted in the semi-additive process using the copper foil as a power supply layer.

In the embodiment, the insulator film 12 is formed using a copper foil with resin (Sumitomo Bakelite Co., Ltd.; APL-4501; copper foil thickness, 18 . m) and the first electrode pattern 13 and the conductor pattern 18 are formed by patterning the copper foil in the subtractive process.

The state formed in this process is equal to FIG. 10(*c*), and processes after this point are those after FIG. 10(*d*).

The mounting board is the same as the mounting board in accordance with the second embodiment of the present invention. Using the manufacturing method described above, the mounting board can be efficiently manufactured. In addition, the mounting board takes over the advantages of the first embodiment of the present invention, and since the conductor pattern 18 is additionally formed, there is obtained an advantage that the wiring density is increased and the number of laminated layers is reduced.

Figure 12:
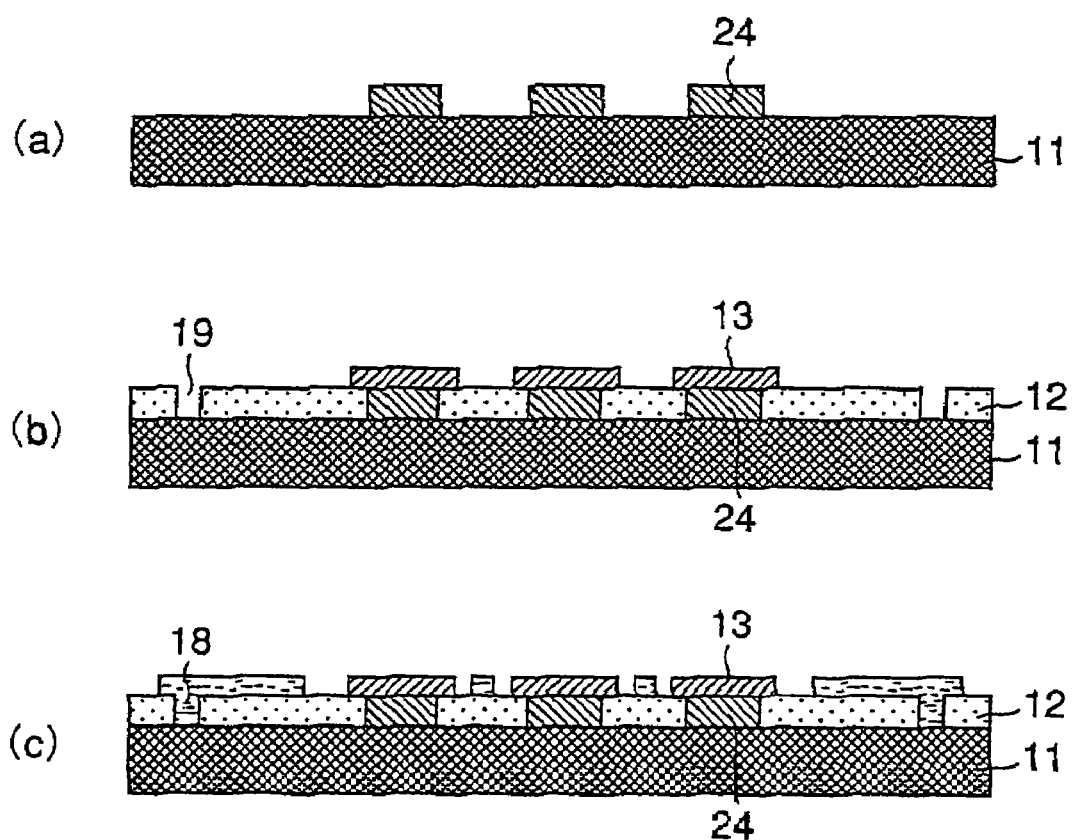
FIG. 12 is a partial cross-sectional view showing a third embodiment of a method of manufacturing a semiconductor device mounting board and a semiconductor package of the present invention.

Subsequently, description will be given of a third embodiment of a method of manufacturing a semiconductor device mounting board and a semiconductor package in accordance with the present invention. FIG. 12(*a*) to FIG. 12(*c*) are partial cross-sectional views showing, in a process sequence, a method of manufacturing a mounting board in accordance with the third embodiment of the present invention. The embodiment is used to manufacture a mounting board in accordance with the second embodiment of the present invention (FIG. 4). In this connection, rinsing and heat treatment are conducted between the processes according to necessity. Excepting that a conductor pattern 18 is connected via the via 19 to the metallic supporter 11, the configuration is equal to that of the method of manufacturing a mounting board in the second embodiment of the present invention.

First, as shown in FIG. 12(*a*), on a surface of the metallic supporter 11 with thickness ranging from 0.1 to 1.5 mm, the projections 24 are formed by one of or a combination of a plating method, etching, conductive pasting, and machining. As an etching barrier for the first electrode pattern 13 in the removal of the projections 24 by etching, it is also possible to form an upper-most layer of the projections 24 with one of metals such as gold, silver, platinum, and palladium.

In the embodiment, a plate of a copper alloy (Kobe Steel, Ltd.; KFC series) is used for the metallic supporter 11 and the projections 24 are formed by plating nickel. In the method of forming the projections 24, a 30 .m thick plating resist layer is formed on the metallic supporter 11, resist opening patterns are formed in areas for the projections 24 by photolithography techniques including exposure and development or by a laser, and then 25-.m thick electrolyte nickel plating is precipitated.

Next, the insulator film 12, the first electrode pattern 13, and the via 19 are formed as shown in FIG. 12(*b*). In the forming of the insulator film 12, when the resin for the insulator film 12 is liquid, a layer of the insulator resin is formed by a spin coat method, a dye coat method, a curtain coat method, or a print method. Moreover, when a dry film or a copper foil with resin is used, the film or foil is laminated by a laminating method or the like and then a process of heat treatment is conducted for the layer to stiffen the layer. In the operation, it is required that the top of the projection 24 appears on the surface of the insulator film 12. Therefore, for a liquid resin, a patterning process is conducted by photolithography if the resin is photosensitive. The resin is shaped by polishing if the resin is non-photosensitive or even if the resin is photosensitive when resolution of the resin is not sufficient.

In addition, for the dry film or the copper foil with resin, it is favorable to dispose a cushion on the film carrier side so that the top of the projection 24 appears in the lamination process. In a case of a dry film, it is also possible to shape the dry film by polishing after the laminating process.

After the insulator film 12 is formed, the first electrode pattern 13 is formed by a subtractive process, a semi-additive process, a fully-additive process, or the like. Particularly, when a resin of the copper foil with resin is used as the insulator film 12, the copper foil used as a carrier may be patterned by the subtractive process. Furthermore, when the copper foil is thin, i.e., has a thickness of 2 .m or less, the patterning may be conducted in the semi-additive process using the copper foil as a power supply layer.

Additionally, the via 19 is formed using a method such as photolithography, laser, or dry etching to expose the metallic supporter 11. In the patterning of the insulator film 12, the via 19 may be simultaneously patterned by photolithography if the film is photosensitive and by laser and dry etching if the film is not photosensitive.

In the embodiment, the insulator film 12 is formed using a copper foil with resin (Sumitomo Bakelite Co., Ltd.; APL-4501; copper foil thickness, 18 .m), the first electrode pattern 13 is formed by patterning the copper foil in the subtractive process, and the via 19 with a via diameter of 80 .m is formed using carbon dioxide laser.

Next, the conductor pattern 18 is formed between and in the periphery of the first electrode patterns 13 to connect the conductor pattern 18 via the via 19 to the metallic supporter 11 as shown in FIG. 12(*c*). The conductor pattern 18 is formed in a subtractive process, a semi-additive process, a fully-additive process, or the like. In the embodiment, after the first electrode patterns 13 is formed, 2-.m thick electroless copper plating is precipitated, and then the conductor pattern 18 is formed in the semi-additive process using the copper plating as a power supply layer.

The state formed in this process is equal to FIG. 10(*c*), and processes after this point are those after FIG. 10(*d*).

Figure 13:
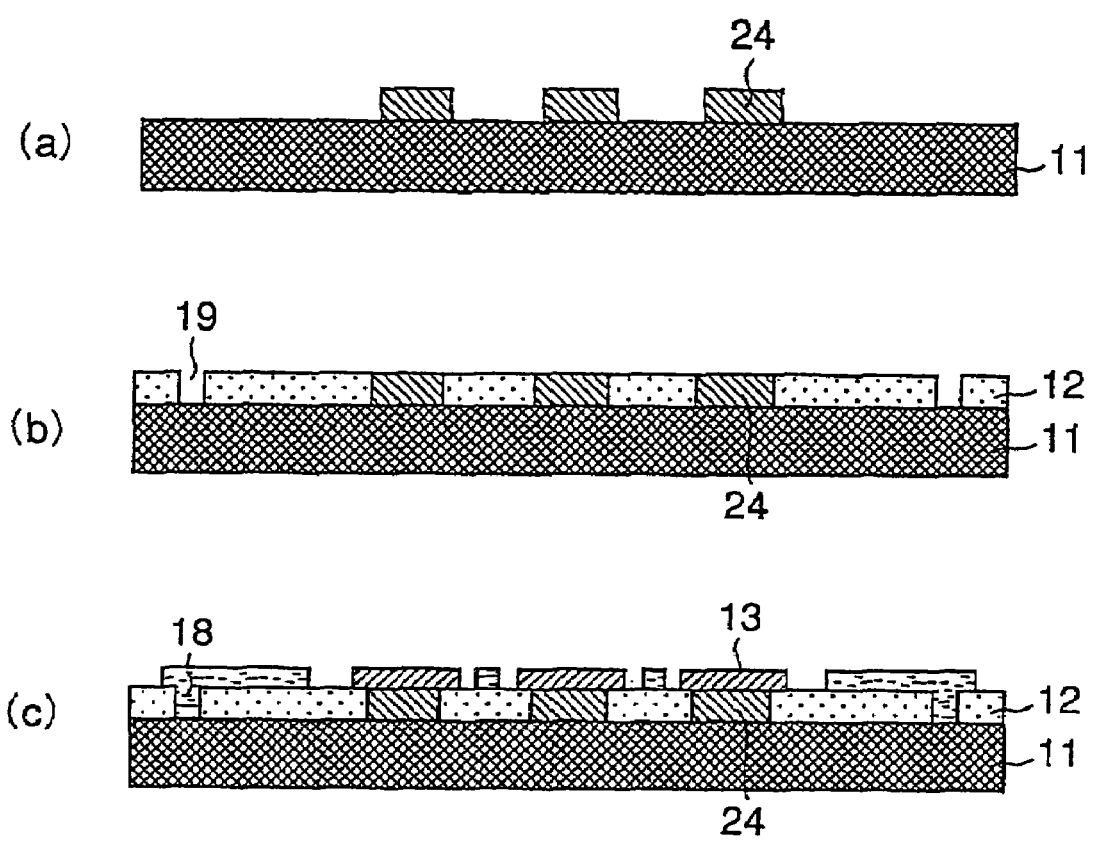
FIG. 13 is a partial cross-sectional view showing a variation of the third embodiment of a method of manufacturing a semiconductor device mounting board and a semiconductor package of the present invention.

Moreover, as shown in FIG. 13, the first electrode pattern 13 and the conductor pattern 18 may be formed at the same time. In this method, there are obtained an advantage in which aligning precision between the first electrode pattern 13 and the conductor pattern 18 is improved and an advantage in which the number of processes is decreased to reduce the cost.

First, as shown in FIG. 13(*a*), on a surface of the metallic supporter 11 with thickness ranging from 0.1 to 1.5 mm, the projections 24 are formed by one of or a combination of a plating method, etching, conductive pasting, and machining. As an etching barrier for the first electrode pattern 13 in the removal of the projections 24 by etching, it is also possible to form an upper-most layer of the projections 24 with one of metals such as gold, silver, platinum, and palladium.

In the embodiment, a plate of a copper alloy (Kobe Steel, Ltd.; KFC series) is used for the metallic supporter 11 and the projections 24 are formed by plating nickel. In the method of forming the projections 24, a 30 .m thick plating resist layer is formed on the metallic supporter 11, resist opening patterns are formed in areas for the projections 24 by photolithography techniques including exposure and development or by a laser, and then 25 .m thick electrolyte nickel plating is precipitated.

Next, the insulator film 12 and the via 19 are formed as shown in FIG. 13(*b*). In the forming of the insulator film 12, when the resin for the insulator film 12 is liquid, a layer of the insulator resin is laminated by a spin coat method, a dye coat method, a curtain coat method, or a print method. Moreover, when a dry film or a copper foil with resin is used, the film or foil is laminated by a laminating method or the like and then a process of heat treatment is conducted for the layer to stiffen the layer. In the operation, it is required that the top of the projection 24 appears on the surface of the insulator film 12. Therefore, for a liquid resin, a patterning process is conducted by photolithography if the resin is photosensitive. The resin is shaped by polishing if the resin is non-photosensitive or even if the resin is photosensitive when resolution of the resin is insufficient.

In addition, for the dry film or the copper foil with resin, it is favorable to dispose a cushion on the film carrier side so that the top of the projection 24 appears in the lamination process. In a case of a dry film, it is also possible to shape the dry film by polishing after the laminating process.

Additionally, the via 19 is formed using a method such as photolithography, laser, or dry etching to expose the metallic supporter 11. In the patterning of the insulator film 12, the via 19 may be simultaneously patterned by photolithography if the film is photosensitive and by laser and dry etching if the film is not photosensitive. In the case of a copper foil with resin, the copper foil is etched and then a via 19 if formed by laser.

In the embodiment, the insulator film 12 is formed using a copper foil with resin (Sumitomo Bakelite Co., Ltd.; APL-4501; copper foil thickness, 18 .m) and the via 19 with a via diameter of 80 .m is formed by use of carbon dioxide laser after etching the copper foil.

Next, the first electrode pattern 13 and the conductor pattern 18 are formed in a subtractive process, a semi-additive process, a fully-additive process, or the like. In the embodiment, 2-.m thick electroless copper plating is precipitated to form the pattern in the semi-additive process using the copper plating as a power supply layer. The state formed in this process is equal to FIG. 10(*c*), and processes after this point are those after FIG. 10(*d*).

The mounting board is the same as the mounting board in accordance with the second embodiment of the present invention. Using the manufacturing method described above, the mounting board can be efficiently manufactured. In addition, the mounting board takes over the advantages of the first and second embodiments of the present invention, and since the conductor pattern 18 is connected to the metallic supporter 11 and the metallic supporter 11 is used also as an electric circuit, there is obtained an advantage that the wiring density is increased and the number of laminated layers is reduced as compared with the second embodiment of the present invention.

Figure 7:
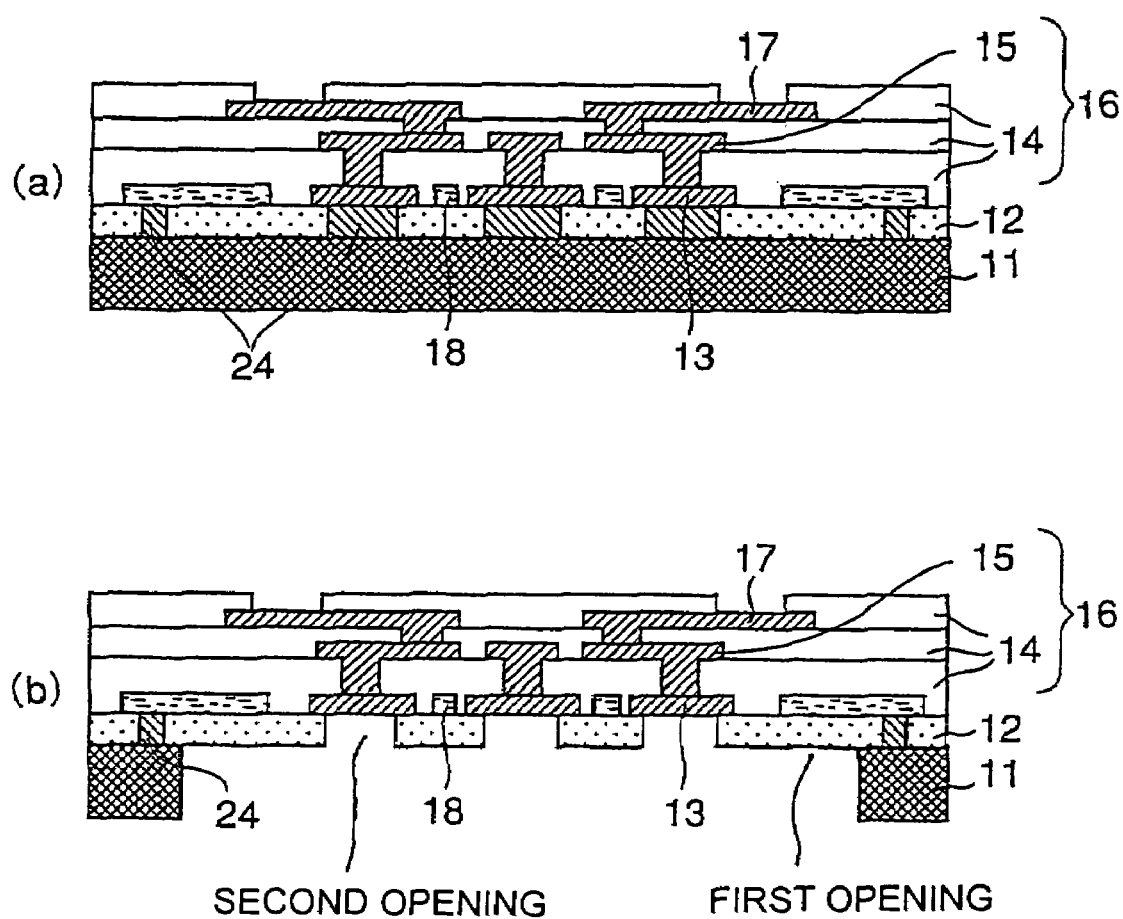
FIG. 7 is an outline of a cross-sectional view showing a variation of the fourth embodiment of a semiconductor device mounting board and a semiconductor package of the present invention.
Figure 14:
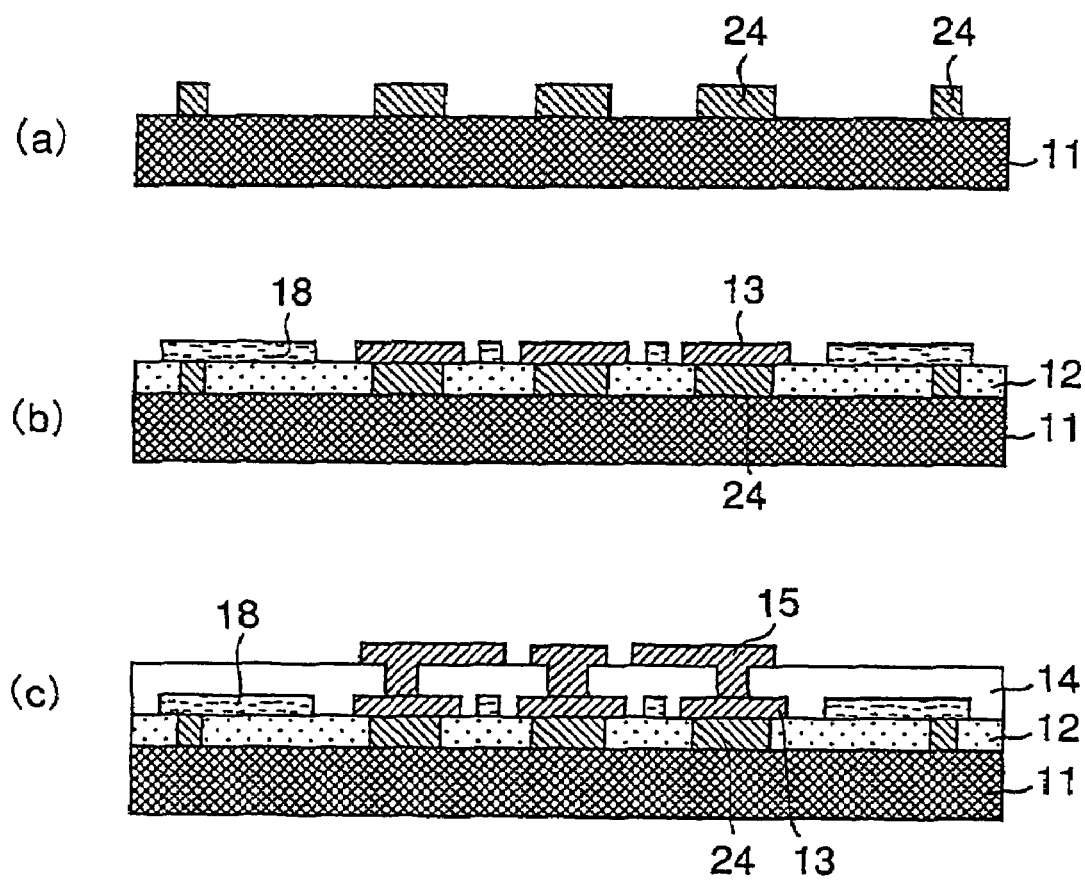
FIG. 14 is a partial cross-sectional view showing a fourth embodiment of a method of manufacturing a semiconductor device mounting board and a semiconductor package of the present invention.

Subsequently, description will be given of a fourth embodiment of a method of manufacturing a semiconductor device mounting board and a semiconductor package in accordance with the present invention. FIGS. 14(*a*) to 14(*c*) are partial cross-sectional views showing, in a process sequence, a method of manufacturing a mounting board in accordance with the fourth embodiment of the present invention. The embodiment is used to manufacture a mounting board in accordance with the fourth embodiment of the present invention (FIG. 7). In this connection, rinsing and heat treatment are conducted between the processes according to necessity. Excepting that the via 19 connecting the conductor pattern 18 to the metallic supporter 11 uses the projection 24, the configuration is equal to that of the method of manufacturing a mounting board in the second embodiment of the present invention.

First, as shown in FIG. 14(*a*), on a surface of the metallic supporter 11 with thickness ranging from 0.1 to 1.5 mm, the projections 24 are formed by one of or a combination of a plating method, etching, conductive pasting, and machining. As an etching barrier for the first electrode pattern 13 in the removal of the projections 24 by etching, it is also possible to form an upper-most layer of the projections 24 with one of metals such as gold, silver, platinum, and palladium.

In the embodiment, a plate of a copper alloy (Kobe Steel, Ltd.; KFC series) is used for the metallic supporter 11 and the projections 24 are formed by plating nickel. In the method of forming the projections 24, a 30-.m thick plating resist layer is formed on the metallic supporter 11, resist opening patterns are formed in areas for the projections 24 by photolithography techniques including exposure and development or by a laser, and then 25 .m thick electrolyte nickel plating is precipitated.

Next, the insulator film 12, the first electrode pattern 13, and the conductor pattern 18 are formed as shown in FIG. 14(*b*). In the forming of the insulator film 12, when the resin for the insulator film 12 is liquid, a layer of the insulator resin is formed by a spin coat method, a dye coat method, a curtain coat method, or a print method. Moreover, when a dry film or a copper foil with resin is used, the film or foil is laminated by a laminating method or the like and then a process of heat treatment is conducted for the layer to stiffen the layer. In the operation, it is required that the top of the projection 24 appears on the surface of the insulator film 12. Therefore, for a liquid resin, a patterning process is conducted by photolithography if the resin is photosensitive. The resin is shaped by polishing if the resin is non-photosensitive or even if the resin is photosensitive when resolution of the resin is not sufficient.

In addition, for the dry film or the copper foil with resin, it is favorable to dispose a cushion on the film carrier side so that the top of the projection 24 appears in the lamination process. In a case of a dry film, it is also possible to shape the dry film by polishing after the laminating process.

After the insulator film 12 is formed, the first electrode pattern 13 and the conductor pattern 18 are formed by a subtractive process, a semi-additive process, a fully-additive process, or the like. Particularly, when a resin of the copper foil with resin is used as the insulator film 12, the copper foil used as a carrier may be patterned by the subtractive process.

Furthermore, when the copper foil is thin, i.e., has a thickness of 2 .m or less, the patterning may be conducted in the semi-additive process using the copper foil as a power supply layer. Additionally, the first electrode pattern 13 and the conductor pattern 18 may be formed in mutually different processes or may be formed in the same process. When the different processes are used, yield is improved by adapting a process suitable for a pattern to be formed, and when the patterns are simultaneously formed, there is obtained an advantage that precision of alignment between the first electrode pattern 13 and the conductor pattern 18 is improved and the number of processes is reduced.

In the embodiment, the insulator film 12 is formed using a copper foil with resin (Sumitomo Bakelite Co., Ltd.; APL-4501; copper foil thickness, 18 .m), and the first electrode pattern 13 and the conductor pattern 18 are formed by patterning the copper foil in the subtractive process.

Subsequently, the insulating layer 14 and the wiring layer 15 are formed as shown in FIG. 14(*c*). In the forming of the insulating layer 14, when the resin for the insulating layer 14 is liquid, a layer of the insulator resin is formed by a spin coat method, a dye coat method, a curtain coat method, or a print method. Moreover, when the insulator resin is a dry film, the insulator resin is laminated by a laminating method or the like and then a process of heat treatment is conducted for the layer to stiffen the insulator resin.

Additionally, the insulator resin is patterned to form a via hole in a photolithography process or the like if the insulator resin is photosensitive and by laser machining or the like if the insulator resin is not photosensitive. The insulator resin is cured to be stiffened to thereby form the insulating layer 14.

Next, the wiring pattern is formed in a subtractive process, a semi-additive process, a fully-additive process, or the like to form the wiring layer 15. In the embodiment, aramid nonwoven fabric saturating epoxy resin (Shin-Kobe Electric Machinery Co., Ltd.; EA-541) is employed for the insulator resin 13, and the wiring layer 14 is formed in a semi-additive process using 2 .m thick electroless copper plating as a power supply layer. The state formed in this process is equal to FIG. 10(c), and processes after this point are those after FIG. 10(d).

The mounting board is the same as the mounting board in accordance with the fourth embodiment of the present invention. Using the manufacturing method described above, the mounting board can be efficiently manufactured. In addition, the mounting board takes over the advantages of the first, second, and third embodiments of the present invention, and since the conductor pattern 18 is connected via the projection 24 to the metallic supporter 11, the number of processes can be reduced. Consequently, there is obtained an advantage with respect to the cost and yield.

Subsequently, description will be given of a fifth embodiment of a method of manufacturing a semiconductor device mounting board and a semiconductor package in accordance with the present invention. FIGS. 15(a) to 15(d) are partial cross-sectional views showing, in a process sequence, a method of manufacturing a mounting board in accordance with the third embodiment of the present invention. The embodiment is used to manufacture a mounting board in accordance with the third embodiment of the present invention (FIG. 5). In this connection, rinsing and heat treatment are conducted between the processes according to necessity. Excepting that the dielectric layer 20 and the conductor layer 21 are disposed for at least one first electrode pattern 13 to form the capacitor 22, the configuration is equal to that of the method of manufacturing a mounting board in the first embodiment of the present invention.

Figure 15:
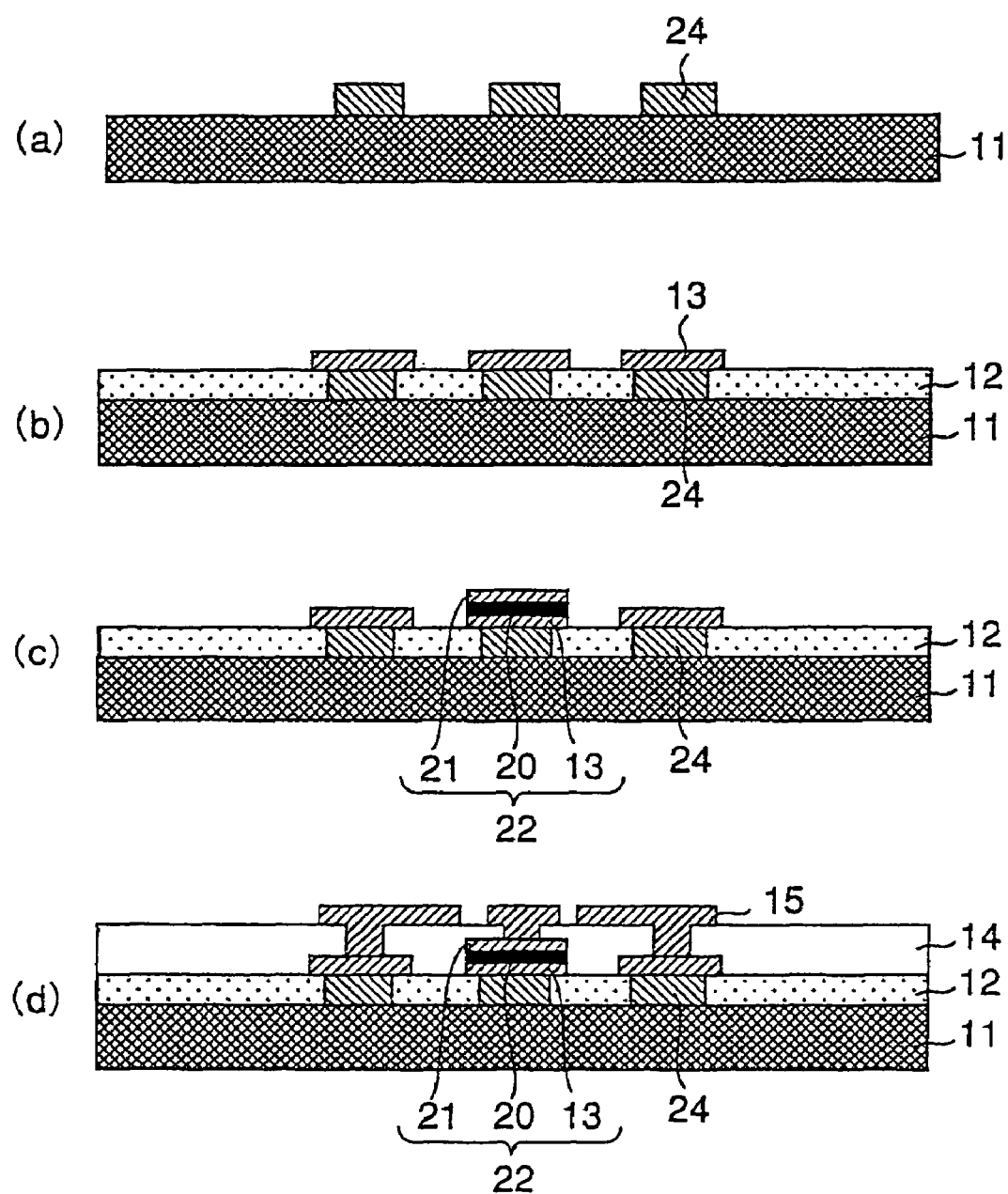
FIG. 15 is a partial cross-sectional view showing a fifth embodiment of a method of manufacturing a semiconductor device mounting board and a semiconductor package of the present invention.

Additionally, although FIG. 15 employs the configuration of the first embodiment of the present invention, FIGS. 10(b) and 10(c) and FIG. 11(b) in the second embodiment, FIGS. 12(b) and 12(c) and FIG. 13(c) of the third embodiment, or FIG. 14(b) of the fourth embodiment of the present invention may be used in place of FIG. 15(b).

First, as shown in FIG. 15(a), on a surface of the metallic supporter 11 with thickness ranging from 0.1 to 1.5 mm, the projections 24 are formed by one of or a combination of a plating method, etching, conductive pasting and machining. As an etching barrier for the first electrode pattern 13 in the removal of the projections 24 by etching, it is also possible to form an upper-most layer of the projections 24 with one of metals such as gold, silver, platinum, and palladium.

In the embodiment, a plate of a copper alloy (Kobe Steel, Ltd.; KFC series) is used for the metallic supporter 11 and the projections 24 are formed by plating nickel. In the method of forming the projections 24, a 30 .m thick plating resist layer is formed on the metallic supporter 11, resist opening patterns are formed in areas for the projections 24 by photolithography techniques including exposure and development or by a laser, and then 25 .m thick electrolyte nickel plating is precipitated.

Next, the insulator film 12 and the first electrode pattern 13 are formed as shown in FIG. 15(b). In the forming of the insulator film 12, when the resin for the insulator film 12 is liquid state, a layer of the insulator resin is formed by a spin coat method, a dye coat method, a curtain coat method, or a print method. Moreover, when a dry film or a copper foil with resin is used, the film or foil is laminated by a laminating method or the like and then a process of heat treatment is conducted for the layer to stiffen the layer. In the operation, it is required that the top of the projection 24 appears on the surface of the insulator film 12. Therefore, for a liquid resin, a patterning process is conducted by photolithography if the resin is photosensitive. The resin is shaped by polishing if the resin is non-photosensitive or even if the resin is photosensitive when resolution of the resin is not sufficient.

In addition, for the dry film or the copper foil with resin, it is favorable to dispose a cushion on the film carrier side so that the top of the projection 24 appears in the lamination process. In a case of a dry film, it is also possible to shape the dry film by polishing after the laminating process.

After the insulator film 12 is formed, the first electrode pattern 13 is formed by a subtractive process, a semi-additive process, a fully-additive process, or the like. Particularly, when a resin of the copper foil with resin is used as the insulator film 12, the copper foil used as a carrier may be patterned by the subtractive process.

Furthermore, when the copper foil is thin, i.e., has a thickness of 2 .m or less, the patterning may be conducted in the semi-additive process using the copper foil as a power supply layer. In the embodiment, the insulator film 12 is formed using a polyimide-based resin (Nitto Electric Industrial Co., Ltd.; AP-6832C), the first electrode pattern 13 is formed in the semi-additive process using a power supply layer by patterning.

Next, the dielectric layer 20 and the conductor layer 21 are disposed on at least one first electrode pattern 13 as shown in FIG. 15(c). Although not particularly shown, for use as a decoupling condenser, the first electrode pattern 13 constituting the condenser also includes a section electrically connected as a pad.

The dielectric layer 20 is formed on the first electrode pattern 13 by a sputtering method, an evaporation method, CVD, an anode oxidation method, or the like. The materials constituting the capacitor 22 are favorably a perovskite-based material such as titanium oxide, tantalum oxide, $Al_2O_3$, $SiO_2$, $Nb_2O_5$, BST ($Ba_xSr_{1-x}TiO_3$), PZT ($PbZr_xTi_{1-x}O_3$), PLZT ($Pb_{1-y}La_yZr_xTi_{1-x}O_3$) or $SrBi_2Ta_2O_9$. However, 0.x.1 and 0<y<1 hold for any one of these compounds.

Moreover, the dielectric layer 20 may include an organic resin or the like capable of achieving a desired dielectric constant. Additionally, the conductor layer 21 is formed on the dielectric layer by a sputtering method, a CVD method, a subtractive process, a semi-additive process, a fully-additive process, or the like. In the embodiment, using a metal mask, BST is laminated 20 nm by the sputtering method on a required electrode pattern 13 and then platinum is laminated 80 nm as the conductor layer 21 on the BST by the sputtering method.

Subsequently, the insulating layer 14 and the wiring layer 15 are formed as shown in FIG. 15(d). In the forming of the insulating layer 14, when the resin for the insulating layer 14 is liquid, a layer of the insulator resin is formed by a spin coat method, a dye coat method, a curtain coat method, or a print method. Moreover, when the insulator resin is a dry film, the insulator resin is laminated by a laminating method or the like and then a process of heat treatment is conducted for the layer to stiffen the insulator resin.

Additionally, the insulator resin is patterned to form a via hole in a photolithography process or the like if the insulator resin is photosensitive and by laser machining or the like if the insulator resin is not photosensitive. The insulator resin is cured to be stiffened to thereby form the insulating layer 14.

Next, the wiring pattern is formed in a subtractive process, a semi-additive process, a fully-additive process, or the like to form the wiring layer 15. In the embodiment, aramid nonwoven fabric saturating epoxy resin (Shin-Kobe Electric Machinery Co., Ltd.; EA-541) is employed for the insulator resin 13, and the wiring layer 14 is formed in a semi-additive process using 2-.m thick electroless copper plating as a power supply layer. The state formed in this process is equal to FIG. 9(c), and processes after this point are those after FIG. 9(d).

The mounting board is the same as the mounting board in accordance with the third embodiment of the present invention. Using the manufacturing method described above, the mounting board can be efficiently manufactured. By configuring the condenser of this type, transmission noise can be reduced, and there can be obtained a mounting board optimal to increase the operation speed.

Figure 16:
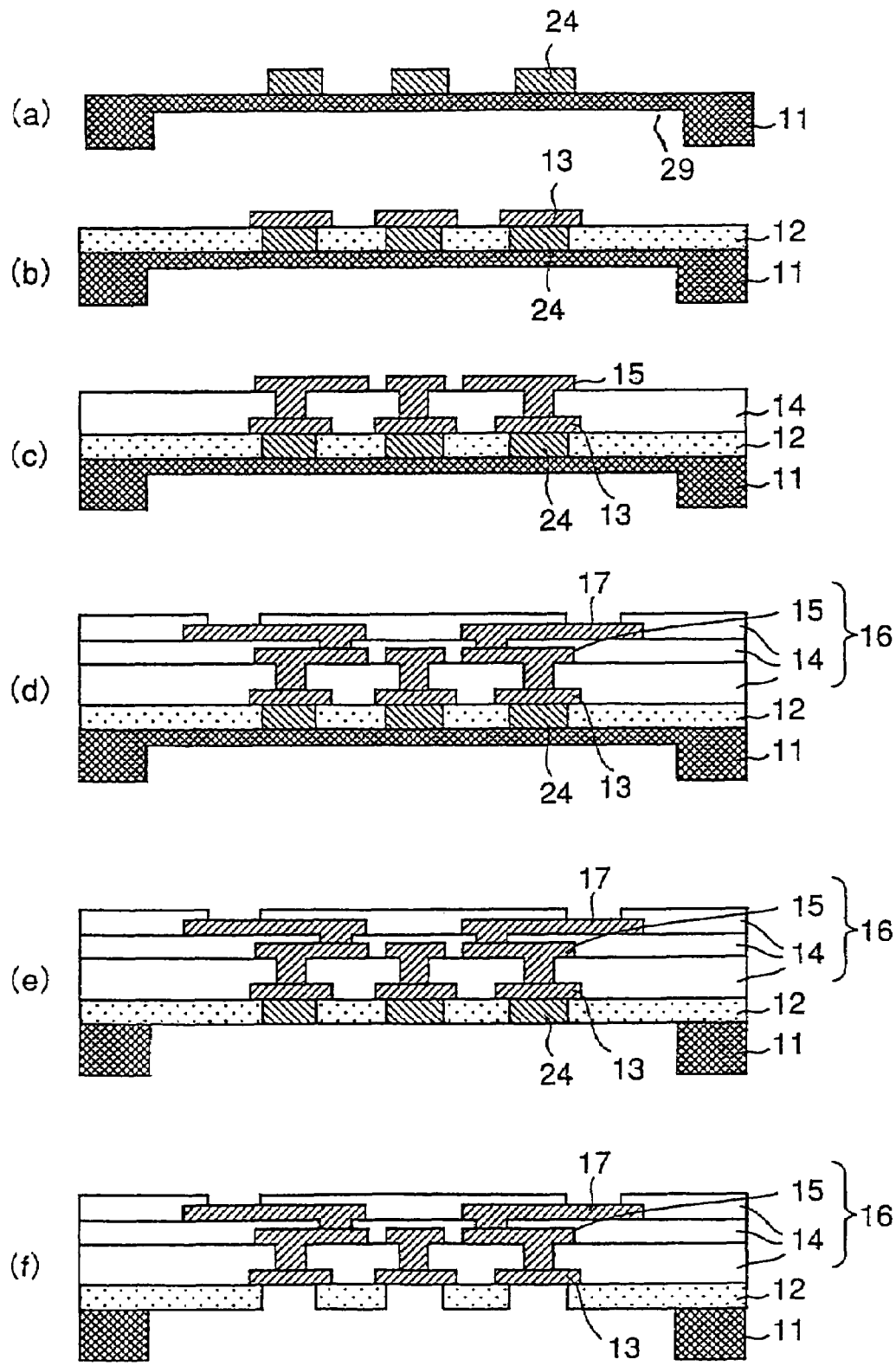
FIG. 16 is a partial cross-sectional view showing a sixth embodiment of a method of manufacturing a semiconductor device mounting board and a semiconductor package of the present invention.

Subsequently, description will be given of a sixth embodiment of a method of manufacturing a semiconductor device mounting board and a semiconductor package in accordance with the present invention. FIG. 16(a) to FIG. 16(f) are partial cross-sectional views showing, in a process sequence, a method of manufacturing a mounting board in accordance with the sixth embodiment of the present invention. In this connection, rinsing and heat treatment are conducted between the processes according to necessity. Excepting that a section to be removed for the metallic supporter is beforehand prepared as a depression 29, the configuration is equal to that of the method of manufacturing a mounting board in the first embodiment of the present invention. Although the method of manufacturing a mounting board of FIG. 16 is shown to be equal to the first embodiment of the present invention, the mounting board may be formed according to the second, third, fourth, or fifth embodiment.

First, as shown in FIG. 16(a), on a rear surface of the metallic supporter 11 with thickness ranging from 0.1 to 1.5 mm, the depression 29 is formed. As for the forming method, there is used one of or a combination of etching and machining. Moreover, the metallic supporter 11 may be formed by fixing a frame-shaped metallic plate onto a flat metallic plate.

Thereafter, on the surface of the metallic supporter 11, the projections 24 are formed by one of or a combination of a plating method, etching, conductive pasting and machining. As an etching barrier for the first electrode pattern 13 in the removal of the projections 24 by etching, it is also possible to form an upper-most layer of the projections 24 with one of metals such as gold, silver, platinum, and palladium.

In the embodiment, a plate of a copper alloy (Kobe Steel, Ltd.; KFC series) is used for the metallic supporter 11 and the projections 24 are formed by plating nickel. In the method of forming the projections 24, a 30-.m thick plating resist layer is formed on the metallic supporter 11, resist opening patterns are formed in areas for the projections 24 by photolithography techniques including exposure and development or by a laser, and then 25-.m thick electrolyte nickel plating is precipitated.

Next, the insulator film 12 and the first electrode pattern 13 are formed as shown in FIG. 16(b). In the forming of the insulator film 12, when the resin for the insulator film 12 is liquid, a layer of the insulator resin is formed by a spin coat method, a dye coat method, a curtain coat method, or a print method. Moreover, when a dry film or a copper foil with resin is used, the film or foil is laminated by a laminating method or the like and then a process of heat treatment is conducted for the layer to stiffen the layer. In the operation, it is required that the top of the projection 24 appears on the surface of the insulator film 12. Therefore, for a liquid resin, a patterning process is conducted by photolithography if the resin is photosensitive. The resin is shaped by polishing, if the resin is non-photosensitive or even if the resin is photosensitive when resolution of the resin is insufficient.

In addition, for the dry film or the copper foil with resin, it is favorable to dispose a cushion on the film carrier side so that the top of the projection 24 appears in the lamination process. In a case of a dry film, it is also possible to shape the dry film by polishing after the laminating process.

After the insulator film 12 is formed, the first electrode pattern 13 is formed by a subtractive process, a semi-additive process, a fully-additive process, or the like. Particularly, when a resin of the copper foil with resin is used as the insulator film 12, the copper foil used as a carrier may be patterned by the subtractive process.

Furthermore, when the copper foil is thin, i.e., has a thickness of 2 .m or less, the patterning may be conducted in the semi-additive process using the copper foil as a power supply layer. In the embodiment, the insulator film 12 is formed using a copper foil with resin (Sumitomo Bakelite Co., Ltd.; APL-4501; copper foil thickness, 18 .m), and the first electrode pattern 13 is formed by patterning the copper foil in the subtractive process.

Subsequently, the insulating layer 14 and the wiring layer 15 are formed as shown in FIG. 16(c). In the forming of the insulating layer 14, when the resin for the insulating layer 14 is liquid, a layer of the insulator resin is formed by a spin coat method, a dye coat method, a curtain coat method, or a print method. Moreover, when the insulator resin is a dry film, the insulator resin is laminated by a laminating method or the like and then a process of heat treatment is conducted for the layer to stiffen the insulator resin.

Additionally, the insulator resin is patterned to form a via hole in a photolithography process or the like if the insulator resin is photosensitive and by laser machining or the like if the insulator resin is not photosensitive. The insulator resin is cured to be stiffened to thereby form the insulating layer 14. Next, the wiring pattern is formed in a subtractive process, a semi-additive process, a fully-additive process, or the like to form the wiring layer 15.

Next, as shown in FIG. 16(d), the process to form the insulating layer 13 and the process to form the wiring layer 14 in a subtractive process, a semi-additive process, a fully-additive process, or the like are repeatedly conducted to form the wiring construction film 16 and the second electrode pattern 17 in the surface layer. In the embodiment, aramid nonwoven fabric saturating epoxy resin (Shin-Kobe Electric Machinery Co., Ltd.; EA-541) is employed for the insulator resin 13, and the wiring layer 14 is formed in a semi-additive process using 2 .m thick electroless copper plating as a power supply layer.

Next, the metallic supporter 11 is selectively removed by etching as shown in FIG. 16(e). For the removing method, etching resist is formed with openings for the etching. In the forming method, when the etching resist is liquid, an etching resist layer is formed by a spin coat method, a dye coat method, a curtain coat method, or a print method. When the etching resist is a dry film, an etching resist layer is formed by a laminating method or the like and then a process of heat treatment is conducted to stiffen the etching resist. The etching resist is patterned in a photolithography process when the etching resist is photosensitive and by laser machining when the etching resist is not photosensitive.

Thereafter, using the etching resist as a mask, the metallic supporter 11 is etched until the insulator film 11 and the projections 24 are exposed. Additionally, since the depression 29 is formed, the etching can be conducted without using etching resist. In the embodiment, the copper alloy plate is selectively removed using alkali copper etching solution including ammonia as a main component (Meltex; A Process) without using etching resist.

Next, the projections 24 are etched or are selectively removed by laser as shown in FIG. 16(f). Laser may be used to shape the contour of the opening after the etching. After removing the projections 24, the exposed surface of the first electrode pattern 13 is normalized to obtain a mounting board. In the embodiment, nickel used for the projections 24 are removed by etching solution including mixture of sulfuric acid:hydrogen peroxide solution:deionaized water=1:1:10.

Using the manufacturing method described above, the mounting board can be efficiently manufactured. Moreover, using the manufacturing method of the embodiment, it is possible to cope respectively with the first, second, third, fourth, and fifth embodiments of the present invention, and hence the respective advantages and be used. In addition, since the area for the etching of the metallic supporter 11 is the depression 29, the quantity of etching can be reduced, and there is obtained an advantage that etching precision and the yield can be improved.

Figure 17:
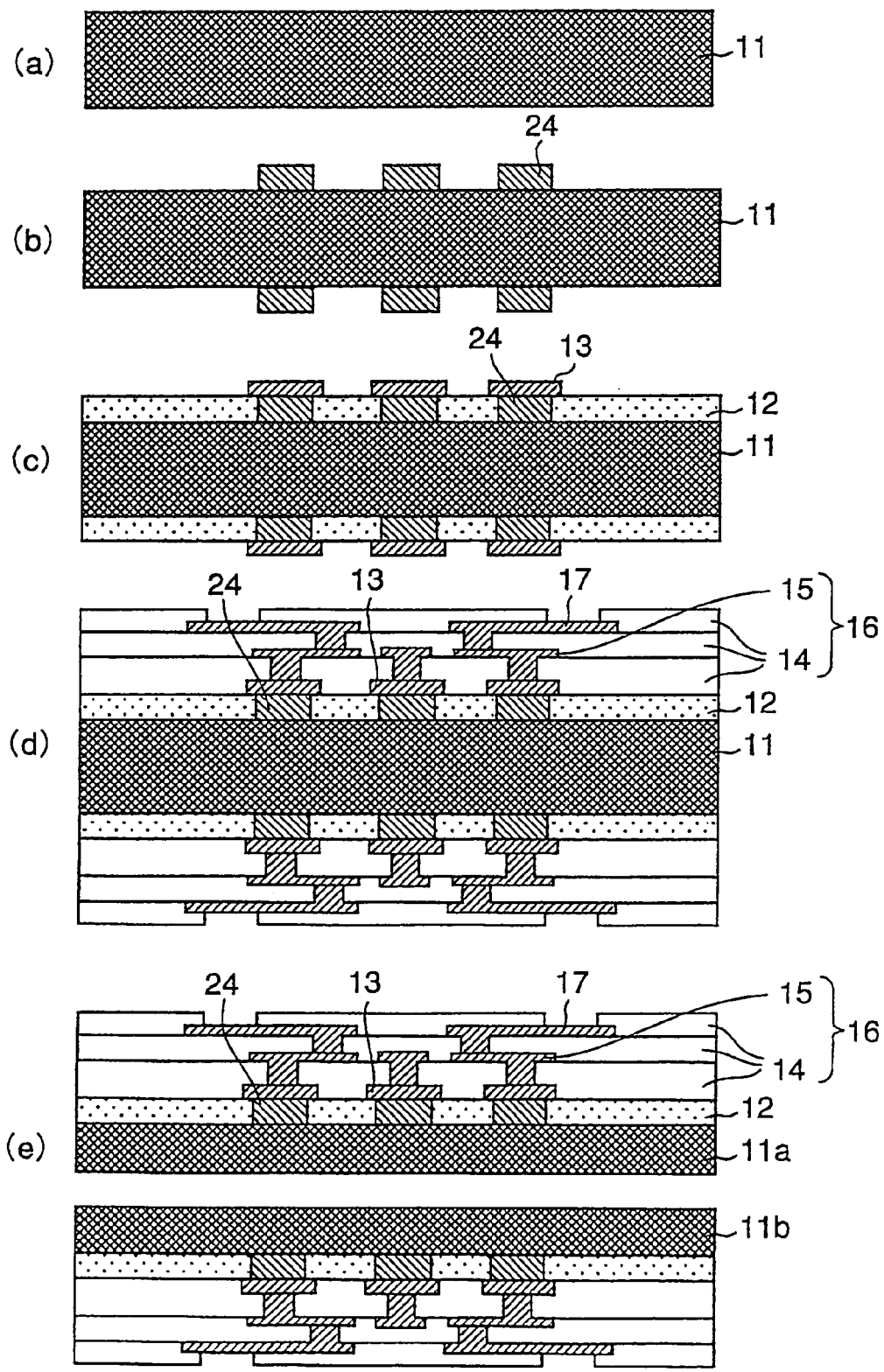
FIG. 17 is a partial cross-sectional view showing a seventh embodiment of a method of manufacturing a semiconductor device mounting board and a semiconductor package of the present invention.

Subsequently, description will be given of a seventh embodiment of a method of manufacturing a semiconductor device mounting board and a semiconductor package in accordance with the present invention. FIGS. 17(a) to 17(e) are partial cross-sectional views showing, in a process sequence, a method of manufacturing a mounting board in accordance with the seventh embodiment of the present invention. In this connection, rinsing and heat treatment are conducted between the processes according to necessity. Excepting that a mounting board is formed on both surfaces of the metallic supporter 11 and then the metallic supporter 11 is subdivided into two partitions in a horizontal direction, the configuration is equal to that of the method of manufacturing a mounting board in the first embodiment of the present invention. Although the method of manufacturing a mounting board of FIG. 17 is shown in the same configuration as for the first embodiment of the present invention, the mounting board may be formed in accordance with the second, third, fourth, or fifth embodiment.

First, as shown in FIG. 17(a), there is prepared a metallic supporter 11 with thickness ranging from 0.2 to 3.0 mm and shearing margin. In this case, after the subdivision in the horizontal direction, the thickness of the metallic supporter 11 favorably ranges from 0.1 to 1.5 mm.

Next, as shown in FIG. 17(b), on both surfaces of the metallic supporter 11, the projections 24 are formed by one of, or a combination of a plating method, etching, conductive pasting and machining. As an etching barrier for the first electrode pattern 13 in the removal of the projections 24 by etching, it is also possible to form an upper-most layer of the projections 24 with one of metals such as gold, silver, platinum, and palladium.

In the embodiment, a plate of a copper alloy (Kobe Steel, Ltd.; KFC series) is used for the metallic supporter 11 and the projections 24 are formed by plating nickel. In the method of forming the projections 24, a 30 .m thick plating resist layer is formed on the metallic supporter 11, resist opening patterns are formed in areas for the projections 24 by photolithography techniques including exposure and development or by a laser, and then 25 .m thick electrolyte nickel plating is precipitated.

Next, the insulator film 12 and the first electrode pattern 13 are formed as shown in FIG. 17(c). In the forming of the insulator film 12, when the resin for the insulator film 12 is liquid, a layer of the insulator resin is formed by a spin coat method, a dye coat method, a curtain coat method, or a print method. Moreover, when a dry film or a copper foil with resin is used, the film or foil is laminated by a laminating method or the like and then a process of heat treatment is conducted for the layer to stiffen the layer. In the operation, it is required that the top of the projection 24 appears on the surface of the insulator film 12. Therefore, for a liquid resin, a patterning process is conducted by photolithography if the resin is photosensitive. The resin is shaped by polishing, if the resin is non-photosensitive or even if the resin is photosensitive when resolution of the resin is not sufficient.

In addition, for the dry film or the copper foil with resin, it is favorable to dispose a cushion on the film carrier side so that the top of the projection 24 appears in the lamination process. In a case of a dry film, it is also possible to shape the dry film by polishing after the laminating process.

After the insulator film 12 is formed, the first electrode pattern 13 is formed by a subtractive process, a semi-additive process, a fully-additive process, or the like. Particularly, when a resin of the copper foil with resin is used as the insulator film 12, the copper foil used as a carrier may be patterned by the subtractive process. Furthermore, when the copper foil is thin, i.e., has a thickness of 2 .m or less, the patterning may be conducted in the semi-additive process using the copper foil as a power supply layer.

In the embodiment, the insulator film 12 is formed using a copper foil with resin (Sumitomo Bakelite Co., Ltd.; APL-4501; copper foil thickness, 18 .m), and the first electrode pattern 13 is formed by patterning the copper foil in the subtractive process.

Subsequently, the insulating layer 14 and the wiring layer 15 are formed as shown in FIG. 17(d). In the forming of the insulating layer 14, when the resin for the insulating layer 14 is liquid, a layer of the insulator resin is formed by a spin coat method, a dye coat method, a curtain coat method, or a print method. Moreover, when the insulator resin is a dry film, the insulator resin is laminated by a laminating method or the like and then a process of heat treatment is conducted for the layer to stiffen the insulator resin.

Additionally, the insulator resin is patterned to form a via hole in a photolithography process or the like if the insulator resin is photosensitive and by laser machining or the like if the insulator resin is not photosensitive. The insulator resin is cured to be stiffened to thereby form the insulating layer 14.

Next, the wiring pattern is formed in a subtractive process, a semi-additive process, a fully-additive process, or the like to form the wiring layer 15. Moreover, the process to form the insulating layer 13 and the process to form the wiring layer 14 in a subtractive process, a semi-additive process, a fully-additive process, or the like are repeatedly conducted to form the wiring construction film 16 and the second electrode pattern 17 in the surface layer. In the embodiment, aramid nonwoven fabric saturating epoxy resin (Shin-Kobe Electric Machinery Co., Ltd.; EA-541) is employed for the insulator resin 13, and the wiring layer 14 is formed in a semi-additive process using 2-.m thick electroless copper plating as a power supply layer.

Next, as shown in FIG. 17(e), the metallic supporter 11 is subdivided at a central position in a horizontal direction into tow partitions to form a second surface. As a subdividing method, a slicer, a water cutter, or the like is used for the subdivision selectively removed by etching as shown in FIG.

16(e). The state formed in this process is equal to FIG. 9(d), and processes after this point are those after FIG. 9(e).

Using the manufacturing method described above, the mounting board can be efficiently manufactured. Moreover, using the manufacturing method of the embodiment, it is possible to cope respectively with the first, second, third, fourth, and fifth embodiments of the present invention, and hence the respective advantages and be used. In addition, since both surfaces of the metallic supporter 11 are used, the number of products is double and hence there is obtained an advantage of improvement of productivity.

Figure 18:
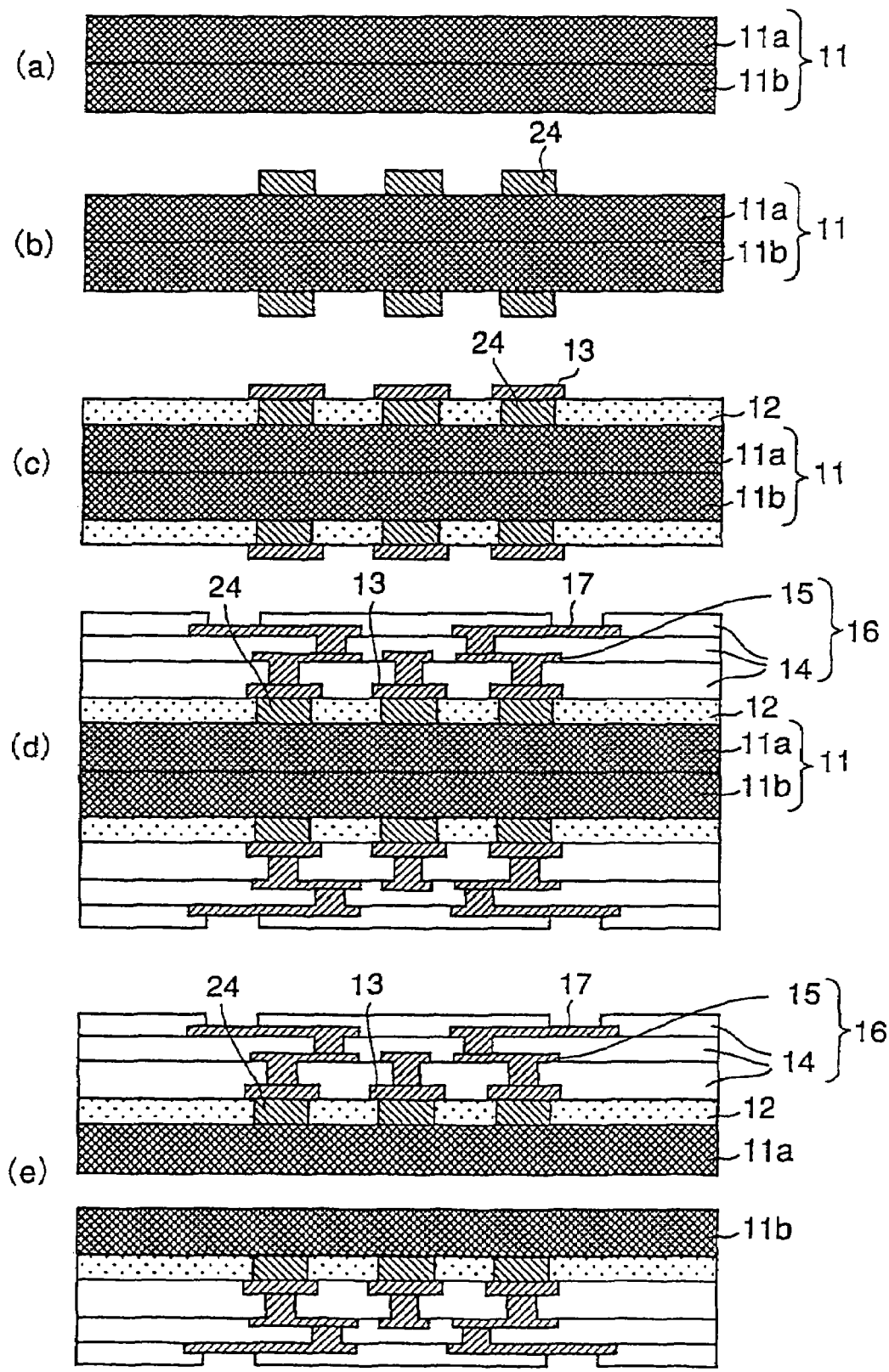
FIG. 18 is a partial cross-sectional view showing a eighth embodiment of a method of manufacturing a semiconductor device mounting board and a semiconductor package of the present invention.

Subsequently, description will be given of an eighth embodiment of a method of manufacturing a semiconductor device mounting board and a semiconductor package in accordance with the present invention. FIG. 18(a) to FIG. 18(e) are partial cross-sectional views showing, in a process sequence, a method of manufacturing a mounting board in accordance with the eighth embodiment of the present invention. In this connection, rinsing and heat treatment are conducted between the processes according to necessity. Excepting that two metallic supporters 11 are fixed to each other, a mounting board is formed on both surfaces thereof, and then the metallic supporters 11 are subdivided, the configuration is equal to that of the method of manufacturing a mounting board in the first embodiment of the present invention. Although the method of manufacturing a mounting board of FIG. 18 is shown in the same configuration as for the first embodiment of the present invention, the mounting board may be formed in accordance with the second, third, fourth, fifth, or sixth embodiment. Particularly, in the contour in which the depression 29 is disposed in the metallic supporter 11, the both surfaces can be formed only by the fixing of the present invention.

First, as shown in FIG. 18(a), a metallic supporter 11a is fixed onto a metallic supporter 11a to have a thickness ranging from 0.1 to 1.5 mm. Moreover, the fixing can also be conducted using a metallic supporter 11 in which a depression 29 is formed. In the fixing, small depressions and projections are formed in the fixing surfaces of the metallic supporters 11a and 11b so that the metallic supporters 11a and 11b clinch or engage with each other; or, the overall or end sections of the metallic supporters 11a and 11b are fixed to each other using a bonding material, welding, or the like. In consideration of the subdivision in FIG. 18(e), the fixing is more suitably conducted in the end sections.

Next, as shown in FIG. 18(b), on both surfaces of the metallic supporter 11, the projections 24 are formed by one of or a combination of a plating method, etching, conductive pasting, and machining. As an etching barrier for the first electrode pattern 13 in the removal of the projections 24 by etching, it is also possible to form an upper-most layer of the projections 24 with one of metals such as gold, silver, platinum, and palladium. In the embodiment, a plate of a copper alloy (Kobe Steel, Ltd.; KFC series) is used for the metallic supporter 11 and the projections 24 are formed by plating nickel. In the method of forming the projections 24, a 30 .m thick plating resist layer is formed on the metallic supporter 11, resist opening patterns are formed in areas for the projections 24 by photolithography techniques including exposure and development or by a laser, and then 25 .m thick electrolyte nickel plating is precipitated.

Next, the insulator film 12 and the first electrode pattern 13 are formed as shown in FIG. 18(c). In the forming of the insulator film 12, when the resin for the insulator film 12 is liquid, a layer of the insulator resin is formed by a spin coat method, a dye coat method, a curtain coat method, or a print method. Moreover, when a dry film or a copper foil with resin is used, the film or foil is laminated by a laminating method or the like and then a process of heat treatment is conducted for the layer to stiffen the layer. In the operation, it is required that the top of the projection 24 appears on the surface of the insulator film 12. Therefore, for a liquid resin, a patterning process is conducted by photolithography if the resin is photosensitive. The resin is shaped by polishing, if the resin is non-photosensitive or even if the resin is photosensitive when resolution of the resin is not sufficient.

In addition, for the dry film or the copper foil with resin, it is favorable to dispose a cushion on the film carrier side so that the top of the projection 24 appears in the lamination process. In a case of a dry film, it is also possible to shape the dry film by polishing after the laminating process.

After the insulator film 12 is formed, the first electrode pattern 13 is formed by a subtractive process, a semi-additive process, a fully-additive process, or the like. Particularly, when a resin of the copper foil with resin is used as the insulator film 12, the copper foil used as a carrier may be patterned by the subtractive process.

Furthermore, when the copper foil is thin, i.e., has a thickness of 2 .m or less, the patterning may be conducted in the semi-additive process using the copper foil as a power supply layer. In the embodiment, the insulator film 12 is formed using a copper foil with resin (Sumitomo Bakelite Co., Ltd.; APL-4501; copper foil thickness, 18 .m), and the first electrode pattern 13 is formed by patterning the copper foil in the subtractive process.

Subsequently, the insulating layer 14 and the wiring layer 15 are formed as shown in FIG. 18(d). In the forming of the insulating layer 14, when the resin for the insulating layer 14 is liquid, a layer of the insulator resin is formed by a spin coat method, a dye coat method, a curtain coat method, or a print method. Moreover, when the insulator resin is a dry film, the insulator resin is laminated by a laminating method or the like and then a process of heat treatment is conducted for the layer to stiffen the insulator resin.

Additionally, the insulator resin is patterned to form a via hole in a photolithography process or the like if the insulator resin is photosensitive and by laser machining or the like if the insulator resin is not photosensitive. The insulator resin is cured to be stiffened to thereby form the insulating layer 14.

Next, the wiring pattern is formed in a subtractive process, a semi-additive process, a fully-additive process, or the like to form the wiring layer 15. Moreover, the process to form the insulating layer 13 and the process to form the wiring layer 14 in a subtractive process, a semi-additive process, a fully-additive process, or the like are repeatedly conducted to form the wiring construction film 16 and the second electrode pattern 17 in the surface layer.

In the embodiment, aramid nonwoven fabric saturating epoxy resin (Shin-Kobe Electric Machinery Co., Ltd.; EA-541) is employed for the insulator resin 13, and the wiring layer 14 is formed in a semi-additive process using 2-.m thick electroless copper plating as a power supply layer.

Next, as shown in FIG. 18(e), the metallic supporter 11 obtained by fixing the overall surfaces of the metallic supporters 11 to each other is subdivided at its center by a slicer, a water cutter, or the like into a metallic supporter 11a and a metallic supporter 11b. For the metallic supporter 11 obtained by fixing the end sections of the metallic supporters 11 to each other, the end sections are sheared to subdivide the metallic supporter 11 into a metallic supporter 11a and a metallic supporter 11b.

The state formed in this process is equal to FIG. 9(d), and processes after this point are those after FIG. 9(e).

Using the manufacturing method described above, the mounting board can be efficiently manufactured. Moreover, using the manufacturing method of the embodiment, it is possible to cope respectively with the first, second, third, fourth, fifth, and sixth embodiments of the present invention, and hence the respective advantages and be used. In addition, since the metallic supporters 11 can be fixed to each other after the metallic supporters 11 are worked, the number of degrees of working freedom of the metallic supporters 11 is increased. Moreover, since both surfaces are used for the fixing, the number of products is double and hence there is obtained an advantage of improvement of productivity.

Subsequently, description will be given of a ninth embodiment of a method of manufacturing a semiconductor device mounting board and a semiconductor package in accordance with the present invention. FIG. 19(a) to FIG. 19(d) are partial cross-sectional views showing, in a process sequence, a method of manufacturing a mounting board in accordance with the seventh embodiment of the present invention. The embodiment is used to manufacture a mounting board in accordance with the fifth embodiment of the present invention (FIG. 8(a), (b), (c)). In this connection, rinsing and heat treatment are conducted between the processes according to necessity.

Figure 19:
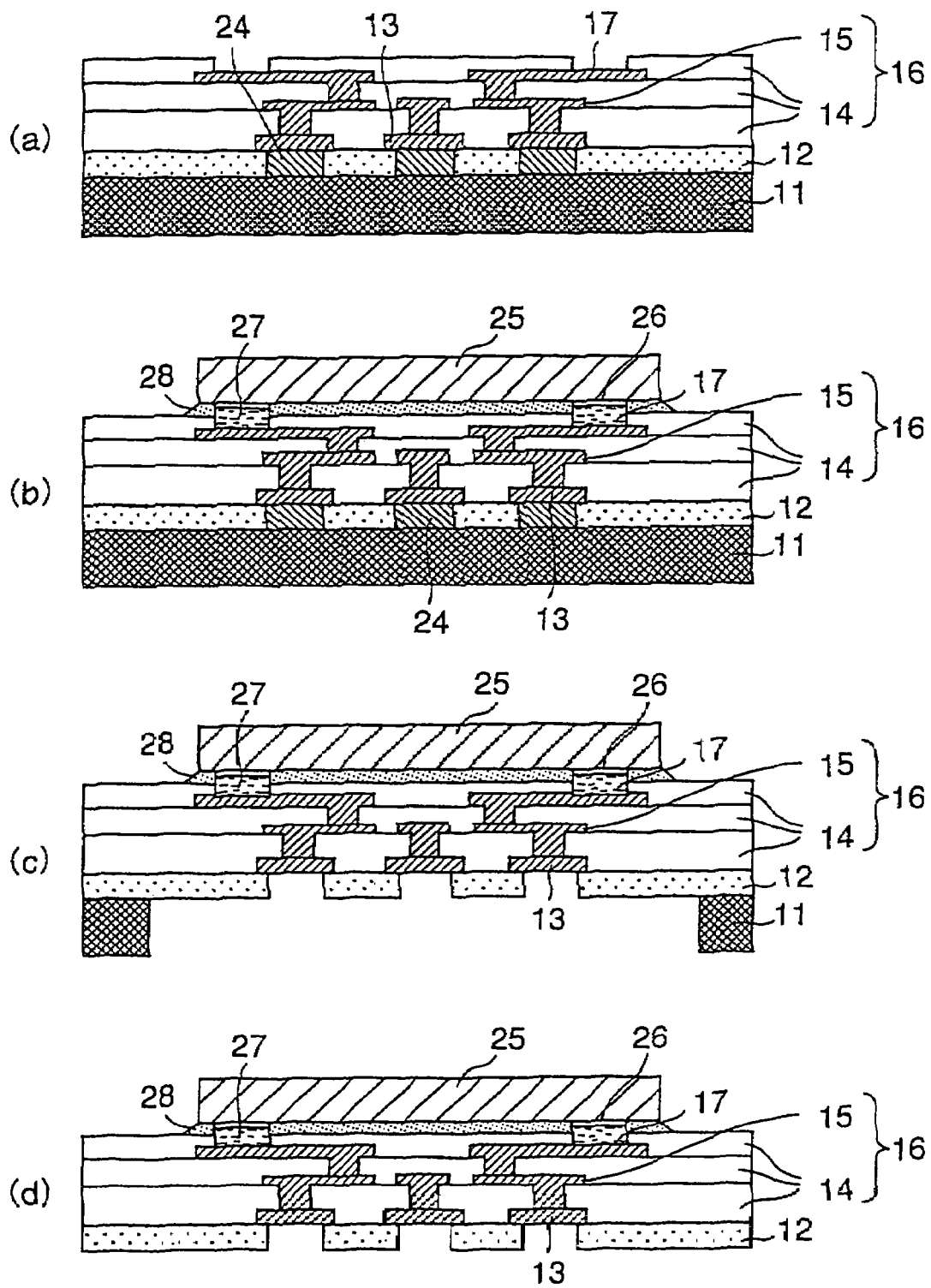
FIG. 19 is a partial cross-sectional view showing a ninth embodiment of a method of manufacturing a semiconductor device mounting board and a semiconductor package of the present invention.

In FIG. 19, connection is established by a flip chip using solder balls as metallic bumps 27. For the metallic bumps 27 metals including gold, copper, tin, and solder are favorably used. Moreover, as connection between the pad 26 and the second electrode pattern 17, wire bonding and tape bonding can be used.

First, as shown in FIG. 19(a), there is prepared a mounting board in the configuration (for example, the configuration of FIG. 9(d)) in which structure is constructed up to the wiring construction film 16 and the second electrode pattern 17 in accordance with the first, second, third, fourth, fifth, sixth, seventh, or eighth embodiment of the present invention.

Next, as shown in FIG. 19(b), the second electrode pattern 17 is coupled with the pad 26 of the semiconductor device 25 using the metallic bumps 27. Additionally, an underfill resin 28 may be filled therein according to necessity. In the embodiment, the connection is conducted using solder balls and then the underfill resin 28 is filled therein.

Next, as shown in FIG. 19(c), the metallic supporter 11 and the projections 24 are selectively removed to expose the first electrode pattern 13. The metallic supporter 11 is removed by etching and the projections 24 are removed by etching or by one of or a combination of the laser and the etching. In the operation, it is favorable to protect by a resist material not to damage the semiconductor device 25 thus mounted. Moreover, when the semiconductor package on which the semiconductor device 25 is mounted has sufficient strength, the metallic supporter 11 may be entirely removed as shown in FIG. 19(d).

Figure 20:
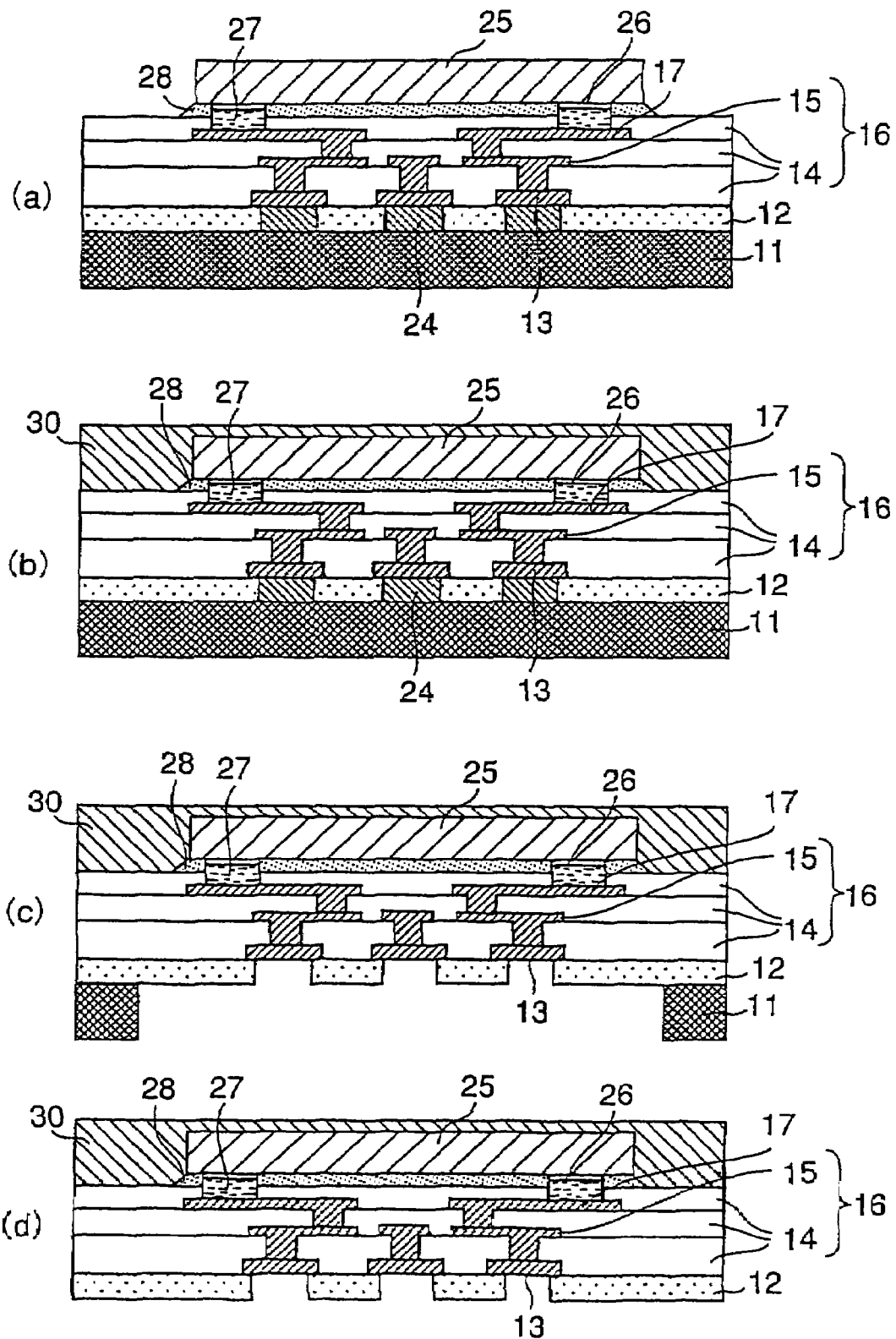
FIG. 20 is a partial cross-sectional view showing a variation of the ninth embodiment of a method of manufacturing a semiconductor device mounting board and a semiconductor package of the present invention.

Additionally, there may be employed a process in which beginning at the state of FIG. 19(b), the semiconductor package on which the semiconductor device 25 is mounted is sealed up using a mold resin 30 as shown in FIG. 20.

First, as shown in FIG. 20(a), there is prepared a mounting board in the configuration (for example, the configuration of FIG. 9(d)) in which structure is constructed up to the wiring construction film 16 and the second electrode pattern 17 in accordance with the first, second, third, fourth, fifth, sixth, seventh, or eighth embodiment of the present invention. The semiconductor device 25 is connected using a flip chip and then the underfill resin 28 is filled therein.

Next, as shown in FIG. 20(b), the package is sealed by the mold resin 30. Thereafter, as shown in FIG. 20(c), the metallic supporter 11 and the projections 24 are selectively removed to expose the first electrode pattern 13. The metallic supporter 11 is removed by etching and the projections 24 are removed by etching or by one of or a combination of the laser and the etching.

In the operation, it is favorable to protect by a resist material the semiconductor device 25 thus mounted from any damage. Moreover, when the semiconductor package on which the semiconductor device 25 is mounted has sufficient strength, the metallic supporter 11 may be entirely removed as shown in FIG. 20(d).

Additionally, there may be employed a process in which beginning at the state of FIG. 19(b), a heat spreader 32 is attached onto the semiconductor package using a spacer 31.

Figure 21:
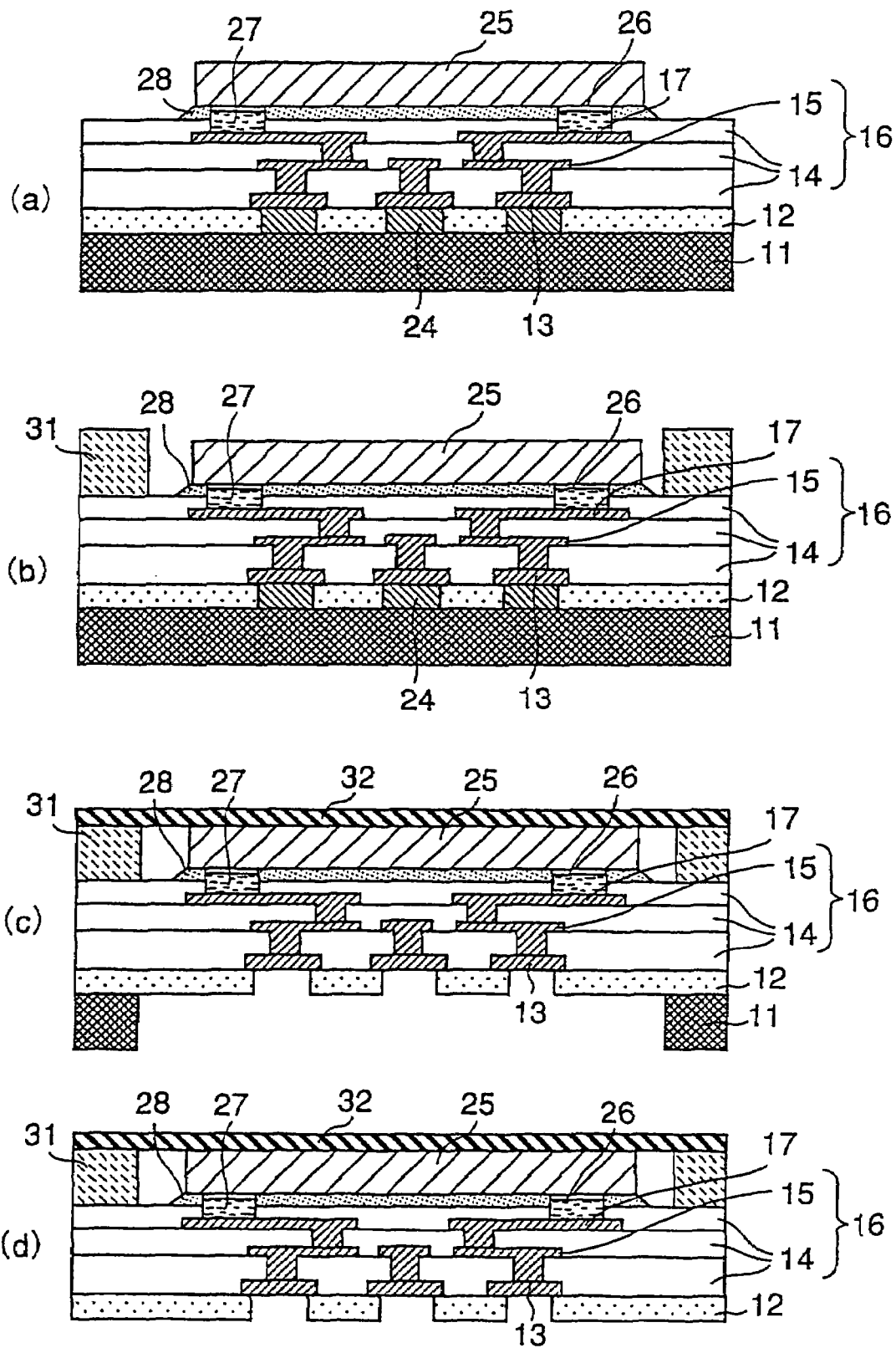
FIG. 21 is a partial cross-sectional view showing a variation of the ninth embodiment of a method of manufacturing a semiconductor device mounting board and a semiconductor package of the present invention.

First, as shown in FIG. 21(a), there is prepared a mounting board in the configuration (for example, the configuration of FIG. 9(d)) in which structure is constructed up to the wiring construction film 16 and the second electrode pattern 17 in accordance with the first, second, third, fourth, fifth, sixth, seventh, or eighth embodiment of the present invention. The semiconductor device 25 is connected using a flip chip and then the underfill resin (28) is filled therein.

Next, as shown in FIG. 21(b), a spacer 31 is attached thereon. Ordinarily, the spacer 31 is a reinforcing frame used when a heat spreader 32 and a heat sink are attached onto the semiconductor device 25. Although stainless steel and copper are employed as its materials, a resin may be used to form the frame if the resin has required strength.

Subsequently, a heat spreader 32 to attach a heat sink is attached thereon as shown in FIG. 21(c). In the attaching, a molding material including heat-conductive metallic paste is used between the semiconductor device 25 and the heat spreader 32 and an insulating molding material is used between the spacer 31 and the heat spreader 32.

After the attaching, the metallic supporter 11 and the projections 24 are selectively removed to expose the first electrode pattern 13. The metallic supporter 11 is removed by etching and the projections 24 are removed by etching or by one of or a combination of the laser and the etching. In the operation, it is favorable to protect by a resist material the heat spreader 32, the spacer 31, and the semiconductor device 25 thus mounted from any damage. Moreover, when the semiconductor package on which the semiconductor device 25 is mounted has sufficient strength, the metallic supporter 11 may be entirely removed as shown in FIG. 21(d).

The mounting board is equal to the semiconductor package in accordance with the fifth embodiment of the present invention. Using the manufacturing method described above, the mounting board can be efficiently manufactured. Using the present invention, deformation events such as the warp and the undulation in the respective processes including the semiconductor device 25 mounting process, the underfill 28 filling process, the mold resin 30 filling process, the spacer 31 process, and the heat spreader 32 process are prevented by the metallic supporter 11. Therefore, mounting reliability and assembly yield are improved.

Subsequently, description will be given of a tenth embodiment of a method of manufacturing a semiconductor device mounting board and a semiconductor package in accordance with the present invention. FIG. 22(a) to FIG. 22(d) are partial cross-sectional views showing, in a process sequence, a method of manufacturing a mounting board in accordance with the tenth embodiment of the present invention. The embodiment is used to manufacture a mounting board in accordance with the fifth embodiment of the present invention (FIG. 8(b), (c), (d)). In this connection, rinsing and heat treatment are conducted between the processes according to necessity.

Figure 22:
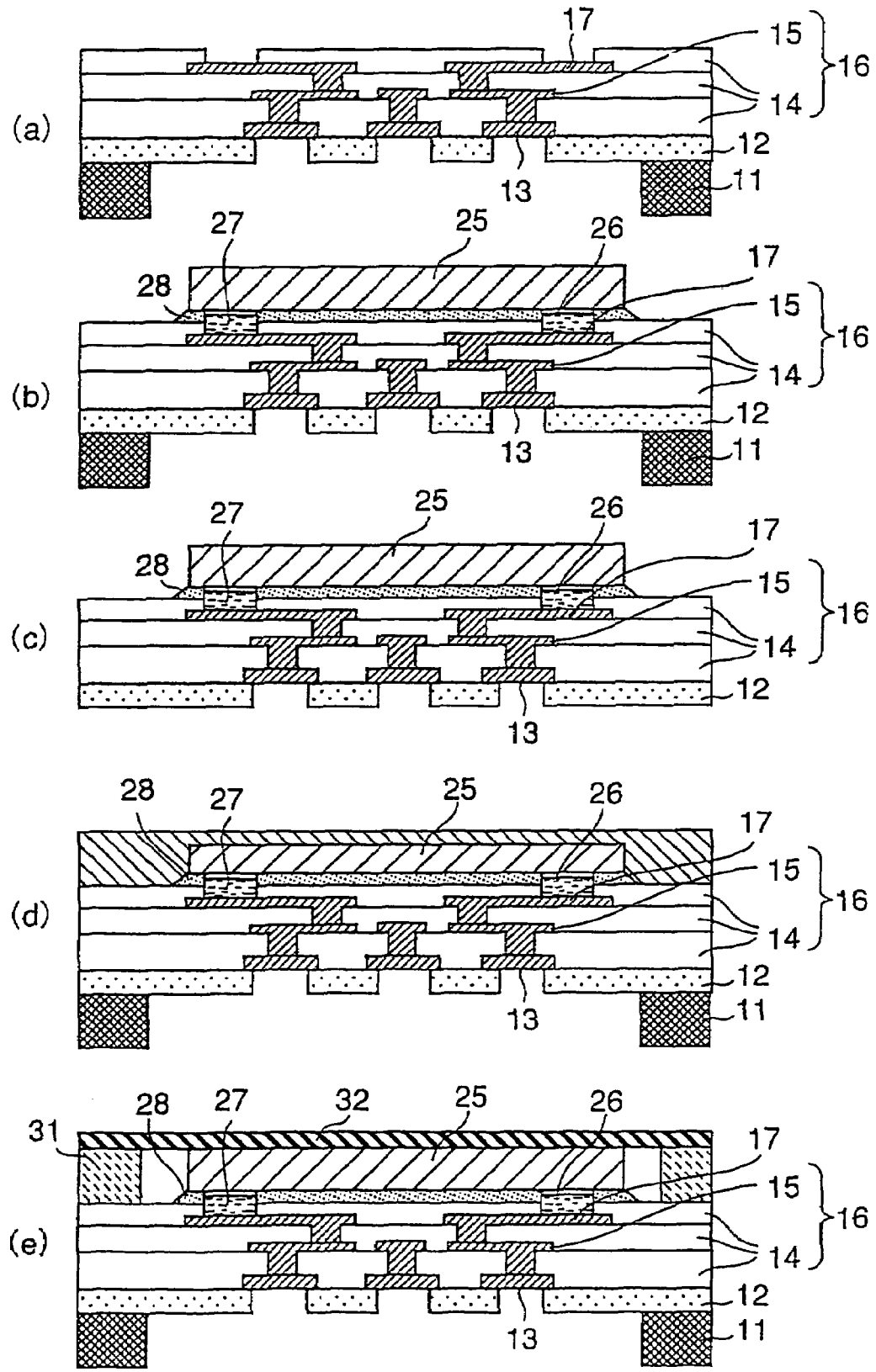
FIG. 22 is a partial cross-sectional view showing a tenth embodiment of a method of manufacturing a semiconductor device mounting board and a semiconductor package of the present invention.

In FIG. 22, connection is established by a flip chip using solder balls as metallic bumps 27. For the metallic bumps 27 metals including gold, copper, tin, solder are favorably used. Moreover, as connection between the pad 26 and the second electrode pattern 17, wire bonding and tape bonding can be used.

First, as shown in FIG. 22(a), there is prepared a mounting board formed in accordance with the first, second, third, fourth, fifth, sixth, seventh, or eighth embodiment of the present invention.

Next, as shown in FIG. 22(b), the second electrode pattern 17 is coupled with the pad 26 of the semiconductor device 25 using the metallic bumps 27. Additionally, an underfill resin 28 may be filled therein according to necessity. In the embodiment, the connection is conducted using solder balls and then the underfill resin 28 is filled therein.

Incidentally, when the mounting board in FIG. 22(a) has a contour in which the metallic supporter 11 is removed, there is obtained a semiconductor package shown in FIG. 22(c). Moreover, when the semiconductor package obtained in FIG. 22(b) has sufficient strength, the metallic supporter 11 disposed as reinforcement may be entirely removed from the configuration as shown in FIG. 22(c).

Additionally, there may be employed a configuration in which the mounting side of the semiconductor device 25 is sealed by the mold resin 30 as shown in FIG. 22(d) and there may be configured a semiconductor package in which the heat spreader 32 is attached using the spacer 31 as shown in FIG. 22(e).

Although FIG. 22(d) and FIG. 22(e) show a contour in which the metallic supporter 11 is kept remained, when the semiconductor package has sufficient strength, the metallic supporter 11 may be removed.

Figure 23:
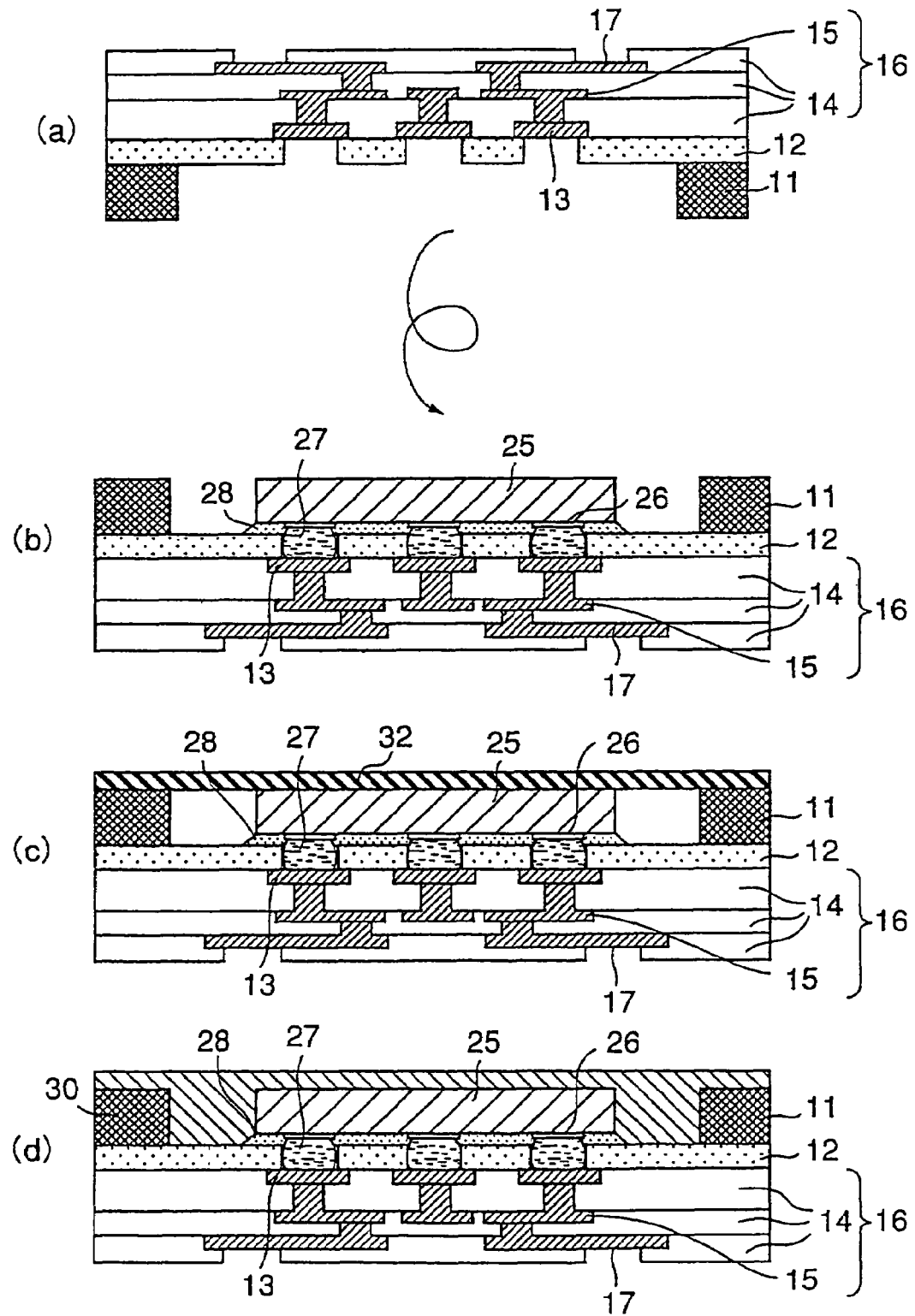
FIG. 23 is a partial cross-sectional view showing a variation of the tenth embodiment of a method of manufacturing a semiconductor device mounting board and a semiconductor package of the present invention.

Also, as shown in FIG. 23, there may be used a process for a semiconductor package in which the metallic supporter 11 is used as the spacer 31 for a reinforcing frame.

First, as shown in FIG. 23(a), there is prepared a mounting board formed in accordance with the first, second, third, fourth, fifth, sixth, seventh, or eighth embodiment of the present invention.

Next, as shown in FIG. 23(b), the first electrode pattern 13 is coupled with the pad 26 of the semiconductor device 25 using the metallic bumps 27. Additionally, an underfill resin 28 may be filled therein according to necessity. In the embodiment, the connection is conducted using solder balls and then the underfill resin 28 is filled therein.

Subsequently, the heat spreader 32 is attached as shown in FIG. 23(c). To obtain this configuration, it is required that the thickness of the metallic supporter 11 is almost equal to that of the semiconductor device 25 from the mounting board. Additionally, there may be employed a configuration to seal by the mold resin 30 without attaching the heat spreader (FIG. 23(d)). In the sealing by the molt resin 30, it is not necessarily required that the thickness of the metallic supporter 11 is equal to the mounting thickness of the semiconductor device 25.

The mounting board is equal to the semiconductor package in accordance with the fifth embodiment of the present invention, and using the manufacturing method, the mounting board can be efficiently manufactured. Using the present invention, the semiconductor device 25 can be mounted after quality of the semiconductor device is determined. Moreover, using the metallic supporter 11 as the spacer 31, the number of semiconductor package assembly steps can be reduced.

Figure 24:
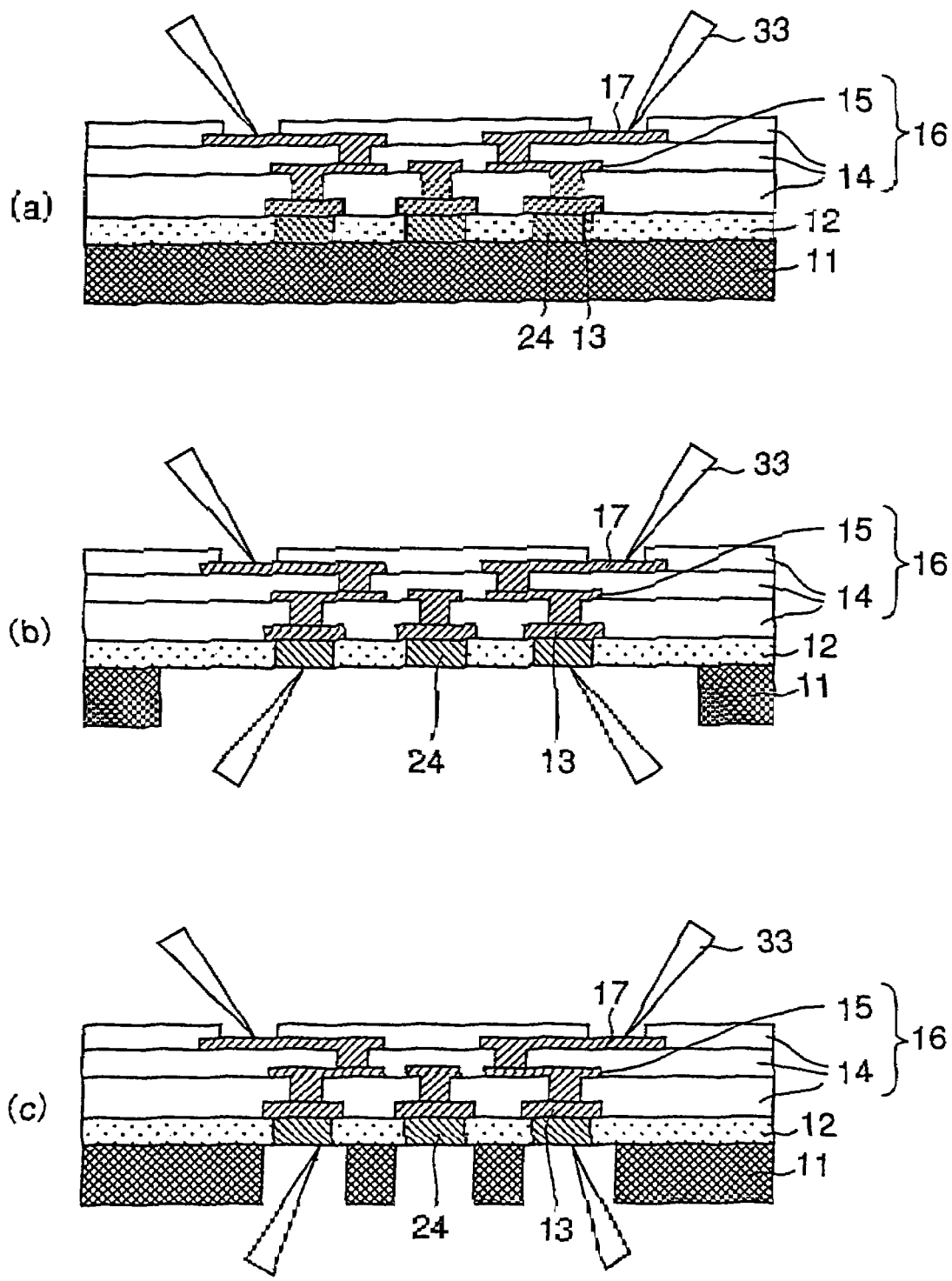
FIG. 24 is a partial cross-sectional view to explain a method of inspecting a semiconductor device mounting board in accordance with the present invention.

Subsequently, description will be given of a method of inspecting a semiconductor device mounting board and a semiconductor package mounting board in accordance with the present invention. FIG. 24(a) to FIG. 24(c) are partial cross-sectional views showing an example of a method of inspecting a mounting board in accordance with the tenth embodiment of the present invention.

FIG. 24(a) is carried out in a configuration of the mounting board before the metallic plate 11 and the projections 24 are removed. Although FIG. 24(a) uses the first embodiment of the present invention (the configuration of FIG. 9(d)), there may also be used a mounting board formed in accordance with the second, third, fourth, fifth, sixth, seventh, or eighth embodiment.

By the inspection, a circuit open test (wrong conduction) can be conducted for the mounting board. A short-circuit test of the circuit is carried out for each layer by conducting pattern retrieval by a pattern recognizing tester or the like. Or, the short-circuit test may be conducted for the circuit of the mounting board after the metallic supporter 11 and the projections 24 are removed. By using the method, the semiconductor device 25 can be mounted after quality of the mounting board to be used in the ninth embodiment of the present invention is determined.

In FIG. 24(b), in a state in which the metallic supporter 11 is selectively removed and the projections 24 are not removed, the open and short-circuit tests of the circuit of the mounting board are conducted using the second electrode pattern 17 and the projections 24. Although FIG. 24(b) uses the first embodiment of the present invention (the configuration of FIG. 9(e)), there may also be used a mounting board formed in accordance with the second, third, fourth, fifth, sixth, seventh, or eighth embodiment. By using the present invention, quality of the mounting board can be determined without damaging the first electrode pattern 13 by the inspection, and connection stability can be achieved in the mounting method of FIG. 23 of the tenth embodiment of the present invention.

In FIG. 24(c), openings are formed such that the metallic supporter 11 is not in contact with the projections 24 to be inspected, and then the open and short-circuit tests of the circuit of the mounting board are conducted using the projections 24 in the openings and the second electrode pattern 17. Although FIG. 24(b) uses the first embodiment of the present invention (openings are formed using the configuration of FIG. 9(d)), there may also be used a mounting board formed in accordance with the second, third, fourth, fifth, sixth, seventh, or eighth embodiment. By using the present invention, quality of the mounting board to be used in the ninth embodiment of the present invention can be electrically and completely determined, and since most of the metallic supporter 11 is kept remained, the operation can be conducted in a state in which the mounting reliability shown in the ninth embodiment is retained.

INDUSTRIAL APPLICABILITY

In accordance with the present invention, higher density and finer wiring of a mounting board can be implemented in association with the increase of terminals and the decrease in the pitch of semiconductor devices, and there can be implemented a mounting board in which external electrodes are also narrow-pitched in association with reduction in size and increase in density of the system.

Furthermore, in accordance with the present invention, a mounting board with high mounting reliability can be provided and a semiconductor package with high performance and high reliability can be implemented.

What is claimed is:

1. A semiconductor device mounting board, characterized by comprising:
    a wiring construction film including an insulator layer and a wiring layer alternately laminated thereon;
    a first electrode pattern in which an electrode pattern is disposed in an insulator layer at an outer-most position on one surface of the wiring construction film, a periphery of a side surface of the electrode pattern is in contact with the insulator layer, at least a surface on the opposite side of the surface of the electrode pattern in contact with the insulator layer is not in contact with the insulator layer, and a boundary between the insulator layer surface and an insulator film is in a plane in which a boundary between the electrode pattern and the insulator film exists;
    a second electrode pattern formed in a surface on an opposite side of the surface of the wiring construction film on which the first electrode pattern is formed;
    the insulator film including an opening pattern exposing the first electrode pattern; and
    a metallic supporter disposed in direct contact with the insulator film rear surface, and
    the metallic supporter is disposed on a rear surface of the insulator film such that the insulator film surface is exposed.

2. The semiconductor device mounting board in accordance with claim 1, characterized in that:
    the respective layers of the wiring layer are connected to each other via a first via disposed in the insulator layer; and
    the second electrode pattern is connected via the wiring layer and the first via to the first electrode pattern.

3. The semiconductor device mounting board in accordance with claim 1, characterized in that:
    a conductor pattern is disposed between and in a periphery of the first electrode patterns; and
    the conductor pattern is connected by the first via to the wiring layer.

4. The semiconductor device mounting board in accordance with claim 1, characterized in that the metallic supporter is connected to the conductor pattern by a second via formed in the insulator film.

5. The semiconductor device mounting board in accordance with claim 1, characterized in that the insulator layer includes an insulating material having a film strength of 70 MPa or more, a percentage of elongation for rupture of 5% or more, a glass transition temperature of 150 degrees Celsius or more, and a thermal expansion coefficient of 60 ppm per degree Celsius or less.

6. The semiconductor device mounting board in accordance with claim 1, characterized in that the insulator layer includes an insulating material having a modulus of elasticity of 10 GPa or more, a thermal expansion coefficient of 30 ppm per degree Celsius or less, and a glass transition temperature of 150 degrees Celsius or more.

7. The semiconductor device mounting board in accordance with claim 1, characterized in that the insulator film has a function as solder resist.

8. The semiconductor device mounting board in accordance with claim 1, characterized in that the insulator film includes a material the same as the material of the insulator layer.

9. The semiconductor device mounting board in accordance with claim 1, characterized by including a condenser including a dielectric layer formed on an upper surface of the first electrode pattern and a conductor layer on an upper surface of the dielectric layer, the conductor layer being electrically connected to the wiring construction film.

10. The semiconductor device mounting board in accordance with claim 1, characterized in that the metallic supporter includes at least one kind of metal selected from a group including stainless steel, iron, nickel, copper, and aluminum or an alloy of the metal thus selected.

11. The semiconductor device mounting board in accordance with claim 1, characterized in that the metallic supporter is disposed on an overall rear surface of the insulator film and includes projections in contact with the first electrode pattern.

12. The semiconductor device mounting board in accordance with claim 1, characterized in that the conductor pattern is connected to the metallic supporter by the projections.

13. The semiconductor package, characterized by including a semiconductor device mounting board described in claim 1 on which at least one semiconductor device is mounted.

14. The semiconductor device mounting board in accordance with claim 1, wherein the insulator film partly covers the first electrode pattern.

15. The semiconductor device mounting board in accordance with claim 11, characterized in that the projections are formed by one of or a combination of a plating method, etching, conductive pasting, and machining.

16. The semiconductor package in accordance with claim 13, characterized in that at least one semiconductor device is mounted on at least one surface.

17. The semiconductor package in accordance with claim 13, characterized in that the semiconductor device is flip-chip connected by either one of fusible metal and conductive resin.

18. The semiconductor package in accordance with claim 13, characterized in that the semiconductor device is linked by at least one kind of material selected from a group including fusible metal, conductive resin, and resin mixed with metal.

19. A method of manufacturing a semiconductor device mounting board, characterized by comprising:
    a step of forming a plurality of projections at desired positions on a surface of a metallic supporter;
    a step of forming an insulator film in an area on the surface of the metallic supporter excepting areas in which the projections are formed;
    a step of forming a first electrode pattern on the insulator film;
    a step of forming an insulator layer in contact with a periphery of a side surface of the first electrode pattern, the insulator layer on the metallic supporter side being in a plane in which a boundary between the first electrode pattern and the insulator film exists;
    a step of forming a wiring layer on one surface of the first electrode pattern on one side on which the surface is not in contact with the insulator film;
    a step of forming, on a surface of the wiring layer on the opposite side of the insulator layer, a wiring construction film by alternately laminating another insulator layer and another wiring layer to each other, the wiring construction film including an insulator layer in an outermost layer;
    a step of forming a second electrode pattern on a surface of the wiring construction film on the opposite side of the surface of the wiring construction film on which the first electrode pattern is formed;

a step of forming a first opening in the metallic supporter to expose the insulator film and the projections;

a step of removing the projections and forming a second opening in the insulator film to expose the first electrode pattern; and a step of shaping a contour of the openings in the insulator film.

20. The method of manufacturing a semiconductor device mounting board in accordance with claim 19, characterized by comprising the step of forming a thin-film condenser on at least one of the first electrode patterns between the step of forming the first electrode pattern and the step of forming the wiring layer (15) on the first electrode pattern.

21. The method of manufacturing a semiconductor device mounting board in accordance with claim 19, characterized by comprising the step, before the step of forming the first electrode pattern, of forming a depression in an area in which the first opening is to be formed.

22. The method of manufacturing a semiconductor device mounting board in accordance with claim 19, characterized by comprising the step of forming solder balls or connection pins so that the first electrode pattern is connected to desired positions of the second electrode pattern.

23. The method of manufacturing a semiconductor device mounting board in accordance with claim 19, characterized in that the metallic supporters include at least one kind of metal selected from a group including stainless steel, iron, nickel, copper, and aluminum or an alloy of the metal thus selected.

24. The method of manufacturing a semiconductor device mounting board in accordance with claim 19, characterized in that the projections are formed by one of or a combination of a plating method, etching, conductive pasting, and machining.

25. The method of manufacturing a semiconductor package, characterized by including a semiconductor device mounting board manufactured in a method described in claim 19 in which a semiconductor device is connected to at least one surface of the board.

26. The method of inspecting a semiconductor device mounting board, characterized in that after forming the second electrode pattern on the metallic supporter of a semiconductor mounting board manufactured in a method described in claim 19 and selectively removing the metallic supporter, the projections are not removed and are used as contact terminals.

27. The method of manufacturing a semiconductor package in accordance with claim 25, characterized in that the semiconductor device is flip-chip connected by either one of fusible metal and conductive resin.

28. A method of manufacturing a semiconductor device mounting board, characterized by comprising:

a step of forming a plurality of projections at desired positions on a surface of a metallic supporter;

a step of forming an insulator film in an area on the surface of the metallic supporter excepting areas in which the projections are formed;

a step of forming a first electrode pattern on the insulator film;

a step of forming a conductor pattern between and in a periphery of the first electrode patterns;

a step of forming an insulator layer in contact with a periphery of a side surface of the first electrode pattern, the insulator layer on the metallic supporter side being in a plane in which a boundary between the first electrode pattern and the insulator film exists;

a step of forming a wiring layer on one surface of the first electrode pattern on one side on which the surface is not in contact with the insulator film; a step of forming, on a surface of the wiring layer on the opposite side of the insulator layer, a wiring construction film by alternately laminating another insulator layer and another wiring layer to each other, the wiring construction film including an insulator layer in an outer-most layer;

a step of forming a second electrode pattern on a surface of the wiring construction film on the opposite side of the surface of the wiring construction film on which the first electrode pattern is formed;

a step of forming a first opening in the metallic supporter to expose the insulator film and the projections;

a step of removing the projections and forming a second opening in the insulator film to expose the first electrode pattern; and a step of shaping a contour of the openings in the insulator film.

29. The method of manufacturing a semiconductor device mounting board in accordance with claim 28, characterized in that the first electrode pattern is formed in the step equal to the step in which the conductor pattern is formed.

30. A method of manufacturing a semiconductor device mounting board, characterized by comprising:

a step of forming a plurality of projections at desired positions on a surface of a metallic supporter;

a step of forming an insulator film in an area on the surface of the metallic supporter excepting areas in which the projections are formed;

a step of forming a first electrode pattern on the insulator film;

a step of forming a via in the insulator film to expose part of the metallic supporter;

a step of forming a conductor pattern between and in a periphery of the first electrode patterns so that the conductor pattern is connected to the metallic supporter by the via;

a step of forming an insulator layer in contact with a periphery of a side surface of the first electrode pattern, the insulator layer on the metallic supporter side being in a plane in which a boundary between the first electrode pattern and the insulator film exists;

a step of forming a wiring layer on one surface of the first electrode pattern on one side on which the surface is not in contact with the insulator layer;

a step of forming, on a surface of the wiring layer on the opposite side of the insulator layer, a wiring construction film by alternately laminating another insulator layer and another wiring layer to each other, the wiring construction film including an insulator layer in an outer-most layer;

a step of forming a second electrode pattern on a surface of the wiring construction film on the opposite side of the surface of the wiring construction film on which the first electrode pattern is formed;

a step of forming a first opening in the metallic supporter to expose the insulator film and the projections;

a step of removing the projections and forming a second opening in the insulator film to expose the first electrode pattern; and a step of shaping a contour of the openings in the insulator film.

31. A method of manufacturing a semiconductor device mounting board, characterized by comprising:

a step of forming a plurality of projections at desired positions on both surfaces of a metallic supporter;

a step of forming an insulator film in an area on the both surfaces of the metallic supporter excepting areas in which the projections are formed;

a step of forming a first electrode pattern on each of the insulator films;

a step of forming an insulator layer in contact with a periphery of a side surface of the first electrode pattern, the insulator layer on the metallic supporter side being in a plane in which a boundary between the first electrode pattern and the insulator film exists;

a step of forming a wiring layer on one surface of the first electrode pattern on one side on which the surface is not in contact with the insulator film;

a step of forming, on a surface of each of the wiring layers on the opposite side of the insulator layer, a wiring construction film by alternately laminating another insulator layer and another wiring layer to each other, the wiring construction film including an insulator layer in an outer-most layer; a step of forming a second electrode pattern on a surface of each of the wiring construction films on the opposite side of the surface of the wiring construction film on which the first electrode pattern is formed;

a step of subdividing the metallic supporter into two partitions in a horizontal direction to form a first and second metallic supporters;

a step of forming first openings in the first and second metallic supporters to expose the respective insulator films and the respective projections;

a step of removing the projections and forming a second opening in the insulator film to expose the first electrode pattern; and a step of shaping a contour of the openings in the insulator film.

32. The method of manufacturing a semiconductor device mounting board in accordance with claim 31, characterized by comprising the step of forming a thin-film condenser on at least one of the first electrode patterns between the step of forming the first electrode patterns and the step of forming the wiring layers on the first electrode patterns.

33. A method of manufacturing a semiconductor device mounting board, characterized by comprising:

a step of forming a plurality of projections at desired positions on both surfaces of a metallic supporter;

a step of forming an insulator film in an area on the both surfaces of the metallic supporter excepting areas in which the projections are formed;

a step of forming a first electrode pattern on the insulator film;

a step of forming a conductor pattern between and in a periphery of the first electrode patterns;

a step of forming an insulator layer in contact with a periphery of a side surface of the first electrode pattern, the insulator layer on the metallic supporter side being in a plane in which a boundary between the first electrode pattern and the insulator film exists;

a step of forming a wiring layer on one surface of the first electrode pattern on one side on which the surface is not in contact with the insulator film; a step of forming, on a surface of each of the wiring layers on the opposite side of the insulator layer, a wiring construction film by alternately laminating another insulator layer and another wiring layer to each other, the wiring construction film including an insulator layer in an outer-most layer;

a step of forming a second electrode pattern on a surface of each of the wiring construction films on the opposite side of the surface of the wiring construction film on which the first electrode pattern is formed;

a step of subdividing the metallic supporter into two partitions in a horizontal direction to form a first and second metallic supporters;

a step of forming first openings in the first and second metallic supporters to expose the respective insulator films and the respective projections;

a step of removing the projections and forming a second opening in the insulator film to expose the first electrode pattern; and a step of shaping a contour of the openings in the insulator film.

34. A method of manufacturing a semiconductor device mounting board, characterized by comprising:

a step of forming a plurality of projections at desired positions on both surfaces of a metallic supporter;

a step of forming an insulator film in an area on the both surfaces of the metallic supporter excepting areas in which the projections are formed;

a step of forming a first electrode pattern on the insulator film;

a step of forming a via in the insulator film to expose part of the metallic supporter; a step of forming a conductor pattern between and in a periphery of the first electrode patterns so that the conductor pattern is connected to the metallic supporter by the via;

a step of forming an insulator layer in contact with a periphery of a side surface of the first electrode pattern, the insulator layer on the metallic supporter side being in a plane in which a boundary between the first electrode pattern and the insulator film exists;

a step of forming a wiring layer on one surface of the first electrode pattern on an opposite side of the insulator layer;

a step of forming, on a surface of the wiring layer on the opposite side of the insulator layer, a wiring construction film by alternately laminating another insulator layer and another wiring layer to each other, the wiring construction film including an insulator layer in an outermost layer;

a step of forming a second electrode pattern on a surface of the wiring construction film on the opposite side of the surface of the wiring construction film on which the first electrode pattern is formed;

a step of subdividing the metallic supporter into two partitions in a horizontal direction to form a first and second metallic supporters;

a step of forming first openings in the first and second metallic supporters to expose the respective insulator films and the respective projections;

a step of removing the projections and forming a second opening in the insulator film to expose the first electrode pattern; and a step of shaping a contour of the openings in the insulator film.

35. A method of manufacturing a semiconductor device mounting board, characterized by comprising:

a step of fixing first and second metallic supporters to each other;

a step of forming a plurality of projections at desired positions on surfaces of the first and second metallic supporters, the surfaces not being fixed to each other;

a step of forming insulator films in areas on the surfaces of the first and second metallic supporters excepting areas in which the projections are formed, the surfaces not being fixed to each other;

a step of forming first electrode patterns on the respective insulator films of the first and second metallic supporters;

a step of forming insulator layers in contact with peripheries of side surfaces of the respective first electrode patterns of the first and second metallic supporters, the insulator layers on the metallic supporter sides being in planes in which boundaries between the first electrode patterns and the insulator films exist;

a step of forming a wiring layer on one surface on a side of each of the first electrode patterns of the first and second metallic supporters, the surface on the side not being in contact with the insulator film;

a step of forming, on a surface of each of the wiring layers on the opposite side of the insulator layer, a wiring construction film by alternately laminating another insulator layer and another wiring layer to each other, the wiring construction film including an insulator layer in an outer-most layer;

a step of forming second electrode patterns on surfaces of the respective wiring construction films on the opposite sides on which the first electrode patterns are formed;

a step of subdividing the first and second metallic supporters into two partitions in a horizontal direction;

a step of forming first openings in the first and second metallic supporters to expose the respective insulator films and the respective projections;

a step of removing the projections and forming second openings in the insulator films to expose the first electrode patterns; and a step of shaping a contour of the openings in the insulator films.

36. A method of manufacturing a semiconductor device mounting board in accordance with claim 35, characterized by comprising the step, before the step of fixing the first and second metallic supporters to each other, of forming depressions in areas in which the first openings are to be formed.

37. A method of manufacturing a semiconductor device mounting board, characterized by comprising:

a step of fixing first and second metallic supporters to each other;

a step of forming a plurality of projections at desired positions on surfaces of the first and second metallic supporters, the surfaces not being fixed to each other;

a step of forming insulator films in areas on the surfaces of the first and second metallic supporters excepting areas in which the projections are formed, the surfaces not being fixed to each other;

a step of forming first electrode patterns on the respective insulator films of the first and second metallic supporters;

conductor patterns a step of forming conductor patterns between and in peripheries of the respective first electrode patterns of the first and second metallic supporters;

a step of forming insulator layers in contact with peripheries of side surfaces of the respective first electrode patterns of the first and second metallic supporters, the insulator layers on the metallic supporter sides being in planes in which boundaries between the first electrode patterns and the insulator films exist; a step of forming a wiring layer on one surface of each of the first electrode patterns of the first and second metallic supporters on the opposite side of the insulator layer;

a step of forming, on a surface of each of the wiring layers on the opposite side of the insulator layer, a wiring construction film by alternately laminating another insulator layer and another wiring layer to each other, the wiring construction film including an insulator layer in an outer-most layer;

a step of forming second electrode patterns on surfaces of the respective wiring construction films on the opposite sides on which the first electrode patterns are formed;

a step of subdividing the first and second metallic supporters into two partitions in a horizontal direction;

a step of forming first openings in the first and second metallic supporters to expose the respective insulator films and the respective projections;

a step of removing the projections and forming second openings in the insulator films to expose the first electrode patterns; and a step of shaping a contour of the openings in the insulator films.

38. A method of manufacturing a semiconductor device mounting board, characterized by comprising:

a step of fixing first and second metallic supporters to each other;

a step of forming a plurality of projections at desired positions on surfaces of the first and second metallic supporters, the surfaces not being fixed to each other;

a step of forming insulator films in areas on the surfaces of the first and second metallic supporters excepting areas in which the projections are formed, the surfaces not being fixed to each other;

a step of forming first electrode patterns on the respective insulator films of the first and second metallic supporters;

a step of forming vias in the respective insulator films to expose part of the first and second metallic supporters;

a step of forming conductor patterns between and in peripheries of the first electrode patterns of the first and second metallic supporters so that the conductor patterns are connected to the metallic supporters by the vias;

a step of forming insulator layers in contact with peripheries of side surfaces of the respective first electrode patterns of the first and second metallic supporters, the insulator layers on the metallic supporter sides being in planes in which boundaries between the first electrode patterns and the insulator films exist;

a step of forming a wiring layer on one surface of each of the first electrode patterns of the first and second metallic supporters on the opposite side of the insulator layer;

a step of forming, on a surface of each of the wiring layers on the opposite side of the insulator layer, a wiring construction film by alternately laminating another insulator layer and another wiring layer to each other, the wiring construction film including an insulator layer in an outer-most layer;

a step of forming second electrode patterns on surfaces of the respective wiring construction films on the opposite sides on which the first electrode patterns are formed;

a step of subdividing the first and second metallic supporters into two partitions in a horizontal direction;

a step of forming first openings in the first and second metallic supporters to expose the insulator films and the projections;

a step of removing the projections and forming second openings in the insulator films to expose the first electrode patterns; and a step of shaping a contour of the openings in the insulator films.

* * * * *